United States Patent
Satoh

(10) Patent No.: US 12,244,316 B2
(45) Date of Patent: Mar. 4, 2025

(54) SEMICONDUCTOR DEVICE HAVING DUTY-CYCLE CORRECTOR

(71) Applicant: MICRON TECHNOLOGY, INC., Boise, ID (US)

(72) Inventor: Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/624,648

(22) Filed: Apr. 2, 2024

(65) Prior Publication Data
US 2024/0250675 A1    Jul. 25, 2024

Related U.S. Application Data

(62) Division of application No. 17/845,764, filed on Jun. 21, 2022, now Pat. No. 11,973,506.

(51) Int. Cl.
*H03K 5/156* (2006.01)
*G11C 11/4076* (2006.01)

(52) U.S. Cl.
CPC ........ *H03K 5/1565* (2013.01); *G11C 11/4076* (2013.01)

(58) Field of Classification Search
None
See application file for complete search history.

(56) References Cited

U.S. PATENT DOCUMENTS

| | | | |
|---|---|---|---|
| 10,784,847 | B1 | 9/2020 | Tandon et al. |
| 11,437,085 | B2 | 9/2022 | Choi et al. |
| 11,509,297 | B2 | 11/2022 | Lee et al. |
| 11,533,045 | B1 | 12/2022 | Li et al. |
| 11,742,016 | B2 * | 8/2023 | Yoon .............. H03K 5/1565 365/149 |
| 11,973,506 | B2 | 4/2024 | Satoh |
| 2023/0412161 | A1 | 12/2023 | Satoh |

* cited by examiner

*Primary Examiner* — Cassandra F Cox
(74) *Attorney, Agent, or Firm* — Dorsey & Whitney LLP

(57) ABSTRACT

An apparatus according to some embodiments comprises: a first clock path including a first duty-cycle adjuster that adjusts a duty cycle of a first input clock signal, a second clock path including a second duty-cycle adjuster that adjusts a duty cycle of a second input clock signal having a different phase from the first input clock signal; and a control circuit configured to detect longest one or shortest one of first, second, third, and fourth time periods to generate a control signal. The first, second, third and fourth time periods are defined by phase differences between rising edges and falling edges of the first and second input clock signals.

20 Claims, 22 Drawing Sheets

| | | | | | | | widen | narrow |
|---|---|---|---|---|---|---|---|---|
| Pattern #1 | A+B > C+D | S1 L | A | > | C | delay iCK0 rise | D | A | advance iCK0 rise | B | A |
| | A+D > B+C | S2 H | A | > | B | | | | | | |
| | A+C > B+D | S3 L | A | > | D | | | | | | |
| Pattern #2 | A+B > C+D | S1 L | A | > | C | delay iCK90 fall | C | D | advance iCK0 fall | C | B |
| | B+C > A+D | S2 H | D | > | C | | | | | | |
| | B+D > A+C | S3 H | B | > | C | | | | | | |
| Pattern #3 | A+B > C+D | S1 L | B | > | D | delay iCK0 rise | D | A | advance iCK0 fall | D | C |
| | B+C > A+D | S2 L | C | > | D | | | | | | |
| | A+C > B+D | S3 L | A | > | D | | | | | | |
| Pattern #4 | A+B > C+D | S1 L | B | > | D | delay iCK90 fall | A | B | advance iCK0 fall | C | B |
| | B+C > A+D | S2 L | B | > | A | | | | | | |
| | B+D > A+C | S3 H | B | > | C | | | | | | |
| Pattern #5 | C+D > A+B | S1 H | D | > | B | delay iCK0 fall | B | C | advance iCK0 rise | B | A |
| | A+D > B+C | S2 H | D | > | C | | | | | | |
| | B+D > A+C | S3 L | D | > | A | | | | | | |
| Pattern #6 | C+D > A+B | S1 H | C | > | A | delay iCK0 fall | B | D | advance iCK0 rise | A | D |
| | A+D > B+C | S2 H | C | > | D | | | | | | |
| | A+C > B+D | S3 L | C | > | B | | | | | | |
| Pattern #7 | C+D > A+B | S1 H | C | > | A | delay iCK90 rise | A | C | advance iCK0 fall | D | C |
| | B+C > A+D | S2 L | B | > | D | | | | | | |
| | A+D > B+C | S3 H | A | > | B | | | | | | |
| Pattern #8 | C+D > A+B | S1 H | C | > | A | delay iCK90 rise | A | B | advance iCK0 rise | A | D |
| | B+C > A+D | S2 L | B | > | A | | | | | | |
| | B+D > A+C | S3 H | D | > | A | | | | | | |

FIG. 10

| Fstage1 | Fstage2 | DLL Ini. | | Fstage3 | Fstage4 |
|---|---|---|---|---|---|
| 4 (8) steps | 2 steps | | | 1 step | |

FIG.11A

| Fstage1 | DLL Ini. | | Fstage2 | Fstage3 | Fstage4 |
|---|---|---|---|---|---|
| 4 (8) steps | | | 2 steps | 1 step | |

FIG.11B

| Fstage1 | DLL Ini. | Fstage2 | Fstage3 | Fstage4 |
|---|---|---|---|---|
| 4 (8) steps | | 2 steps | 1 step | |

# SEMICONDUCTOR DEVICE HAVING DUTY-CYCLE CORRECTOR

CROSS REFERENCE TO RELATED APPLICATION(S)

This application is a divisional application of U.S. application Ser. No. 17/845,764, filed Jun. 21, 2022. The aforementioned application is incorporated herein by reference, in its entirety, for any purpose.

BACKGROUND

A semiconductor device such as a DRAM may include a duty-cycle corrector (DCC) for keeping a duty-cycle of an internal clock signal at 50%. In regard to an internal clock signal having a significantly high frequency; however, it is difficult to adjust the duty-cycle while keeping the original frequency. Therefore, in regard to the internal clock signal having a significantly high frequency, it is necessary to adjust the duty-cycle by using a plurality of divided clock signals generated by dividing the internal clock signal.

BRIEF DESCRIPTION OF THE DRAWINGS

FIG. 10 is an explanatory diagram of an operation of an analyzing circuit;

FIGS. 11A to 11C are schematic diagrams for explaining control stages of counters;

FIG. 13 is a diagram showing a relation between count values of counters and control codes;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides in sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
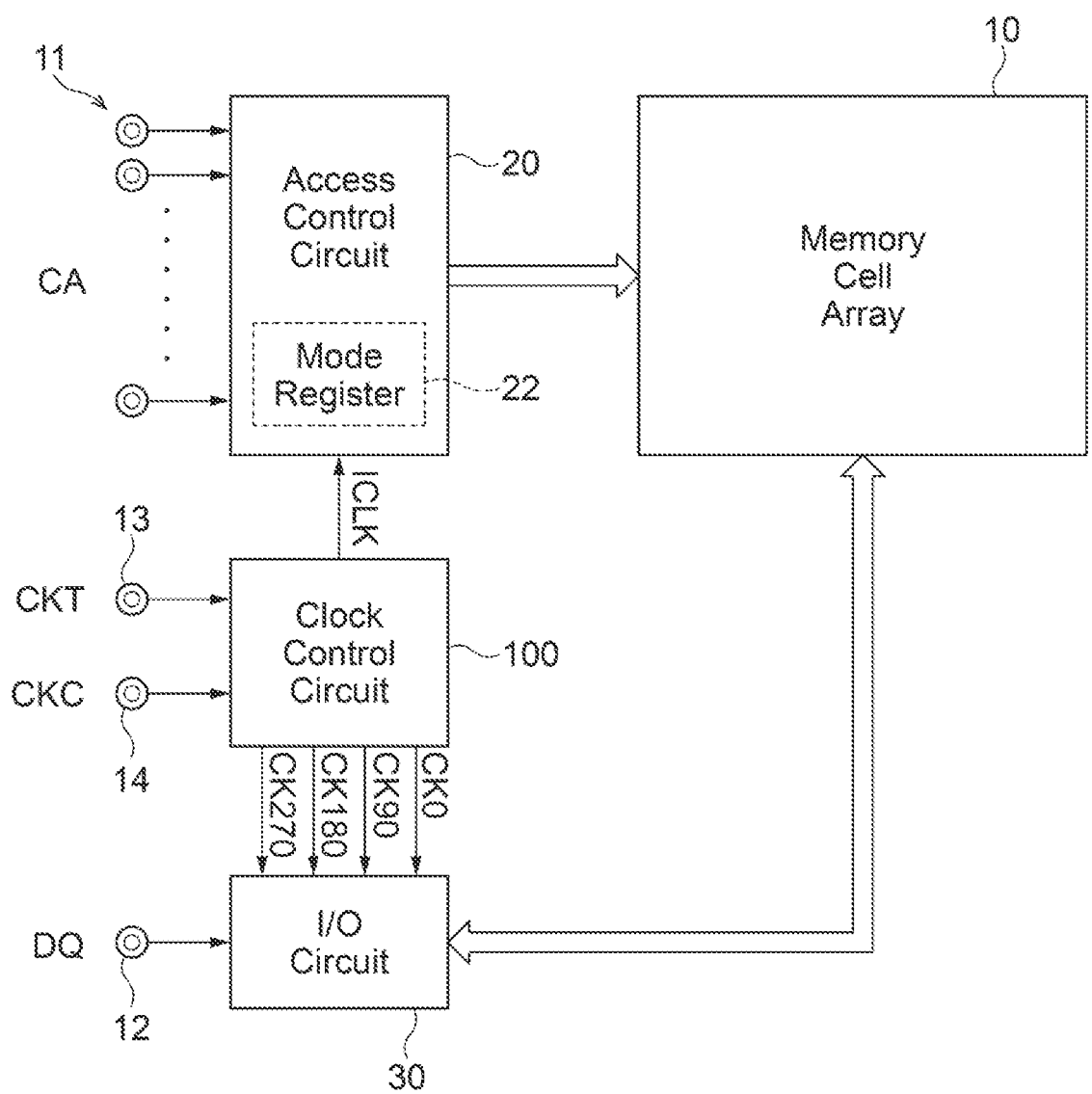
FIG. 1 is a block diagram showing a configuration of a semiconductor device according to an embodiment of the present disclosure.

FIG. 1 is a block diagram showing a configuration of a semiconductor device according to an embodiment of the present disclosure. A semiconductor device according to the present embodiment is a DRAM and includes a memory cell array 10, an access control circuit 20, an I/O circuit 30, and a clock control circuit 100 as shown in FIG. 1. The access control circuit 20 makes access to the memory cell array 10 based on a command address signal CA input via a command address terminal 11. With this access operation, when the command address signal CA indicates a read operation, read data DQ read out from the memory cell array 10 is output to a data terminal 12 via the I/O circuit 30. When the command address signal CA indicates a write operation, write data DQ input to the data terminal 12 from outside is written into the memory cell array 10 via the I/O circuit 30. The access control circuit 20 includes a mode register 22. Various operating parameters are set in the mode register 22. The clock control circuit 100 generates various internal clock signals including internal clock signals ICLK, CK0, CK90, CK180, and CK 270, for example, based on complementary external clock signals CKT and CKC input via clock terminals 13 and 14. The access control circuit 20 operates in synchronization with the internal clock signal ICLK. The I/O circuit 30 serially outputs the read data DQ in synchronization with the internal clock signals CK0, CK90, CK180, and CK270.

Figure 2:
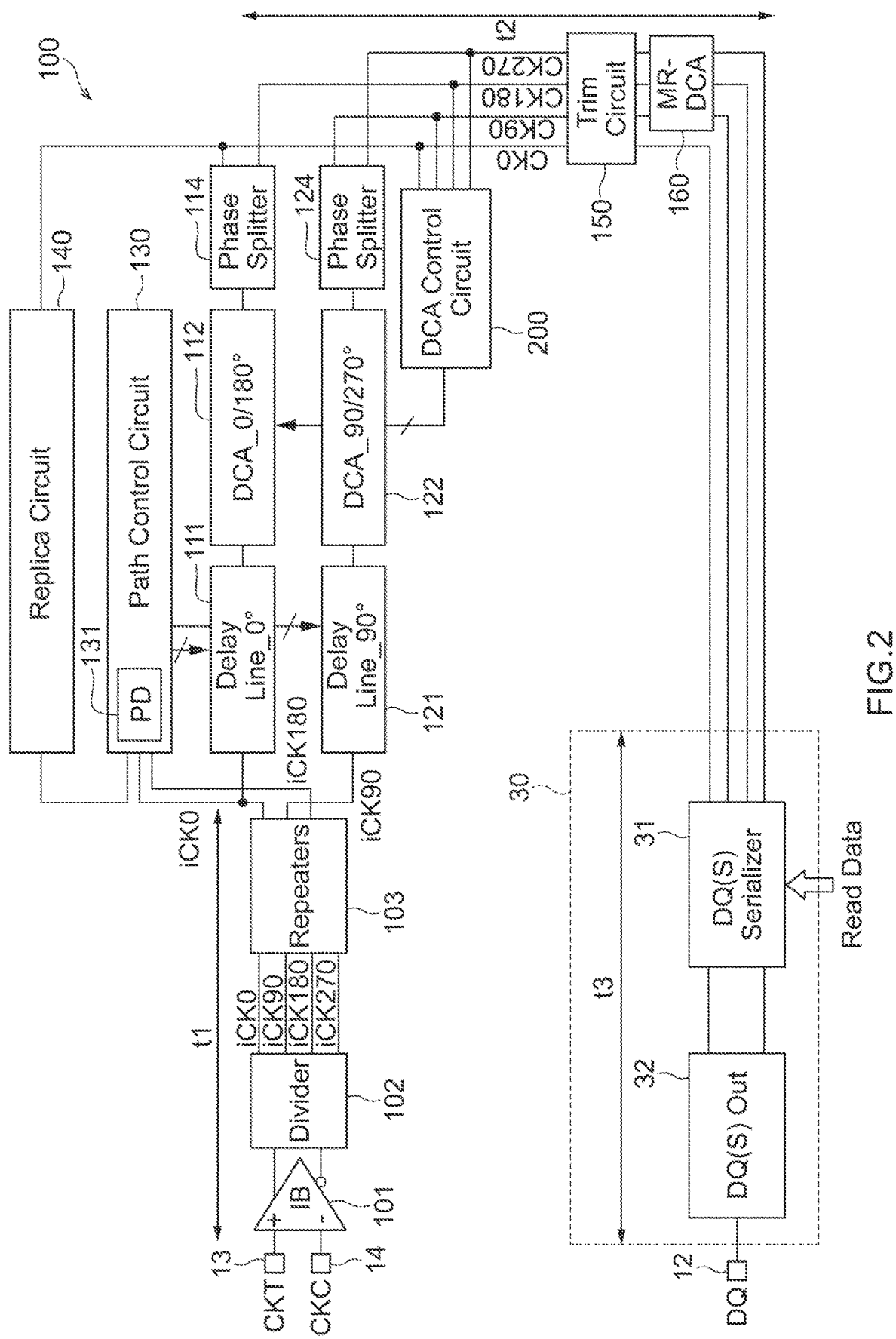
FIG. 2 is a block diagram showing a configuration of a clock control circuit.

FIG. 2 is a block diagram showing a configuration of the clock control circuit 100. The clock control circuit 100 includes a divider circuit 102 that divides the external clock signals CKT and CKC supplied via an input buffer 101 to generate divided clock signals iCK0, iCK90, iCK180, and iCK270. The cycle of each of the divided clock signals iCK0, iCK90, iCK180, and iCK270 is two times longer than that of the external clock signals CKT and CKC. The phase of the divided clock signals iCK0, iCK90, iCK180, and iCK270 and the phase of the external clock signals CKT and CKC are different from each other by 90 degrees. The divided clock signals iCK0 and iCK90 are input to delay lines 111 and 121, respectively, through repeaters 103. The divided clock signals iCK0 and iCK180 are input to a path control circuit 130 through the repeaters 103. The delay lines 111 and 121 delay the divided clock signals iCK0 and iCK90, respectively. The delays in the delay lines 111 and 121 are controlled by the path control circuit 130. The divided clock signals iCK0 and iCK90 delayed by the delay lines 111 and 121 are input to duty-cycle adjusters (DCAs) 112 and 122, respectively. The DCA 112 adjusts timings of a rising edge and a falling edge of the divided clock signal iCK0. The DCA 122 adjusts timings of a rising edge and a falling edge of the divided clock signal iCK90. The operations of the DCAs 112 and 122 are controlled by a DCA control circuit 200. The divided clock signal iCK0 with the timings adjusted by the DCA 112 is supplied to a phase splitter 114. The phase splitter 114 generates, based on the divided clock signal iCK0, the internal clock signal CK0 having the same phase as the divided clock signal iCK0 and the internal clock signal CK180 having the opposite phase to the divided clock signal iCK0. The divided clock signal iCK90 with the timings adjusted by the DCA 122 is supplied to a phase splitter 124. The phase splitter 124 generates, based on the divided clock signal iCK90, the internal clock signal CK90 having the same phase as the divided clock signal iCK90 and the internal clock signal CK270 having the opposite phase to the divided clock signal iCK90.

Figure 3:
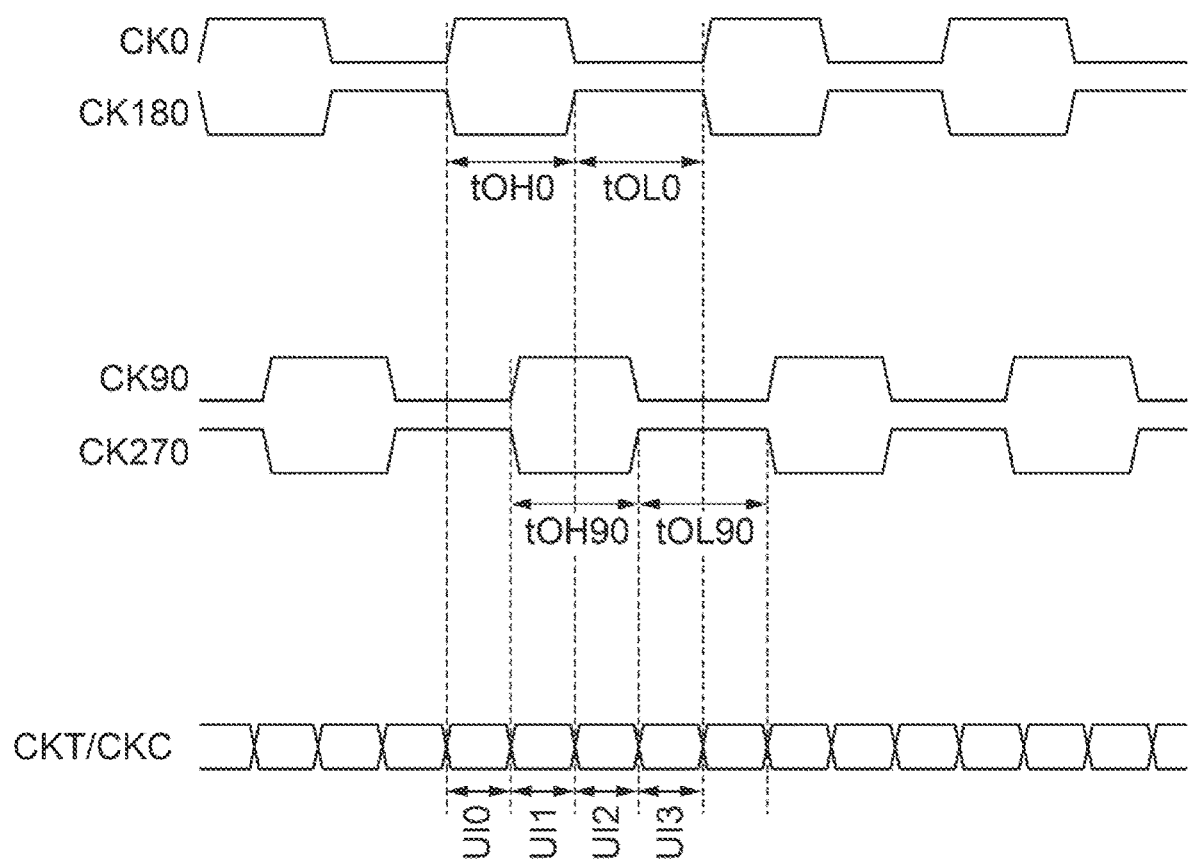
FIG. 3 shows waveforms of internal clock signals.

The internal clock signals CK0, CK90, CK180, and CK270 have waveforms shown in FIG. 3. The internal clock signals CK0, CK90, CK180, and CK270 are supplied to the I/O circuit 30 via a trim circuit 150 and a DCA 160. The trim circuit 150 is a circuit for adjusting a delay difference between rising edges of the internal clock signals CK0, CK90, CK180, and CK270 in order to correct an error of a duty-cycle detector (DCD) included in the DCA control circuit 200 and/or to correct variations in the DCA 160 and the I/O circuit 30. Trimming for the trim circuit 150 is performed in a manufacturing stage. The DCA 160 is a circuit for adjusting a delay difference between the rising edges of the internal clock signals CK0, CK90, CK180, and CK270 with the parameters set in the mode register 22. The I/O circuit 30 includes a serializer 31 that receives the internal clock signals CK0, CK90, CK180, and CK270 and read data read out from the memory cell array 10, and an output buffer 32 driven by the serializer 31. With this configuration, the read data read out from the memory cell array 10 is serially output to the data terminal 12 in synchronization with the internal clock signals CK0, CK90, CK180, and CK270. Since the serializer 31 performs parallel-to-serial conversion for the read data in synchronization with the rising edges of the internal clock signals CK0, CK90, CK180, and CK270, the widths of periods UI0, UI1, UI2, and UI3 has to be kept constant.

The internal clock signal CK0 is fed back to the path control circuit 130 via a replica circuit 140. The delay of the internal clock signal CK0 by the replica circuit 140 is set to be the same as the total (=t1+t2+t3) of a delay t1 in an input section including the input buffer 101, the divider circuit 102, and the repeaters 103, a delay t2 in a clock tree that propagates the internal clock signals CK0, CK90, CK180, and CK270, and a delay t3 in the I/O circuit 30. The path control circuit 130 includes a phase detector 131 comparing the phase of the delayed internal clock signal CK0 output from the replica circuit 140 and the phase of the divided clock signal iCK0 or iCK180 with each other, and controls the delay in each of the delay lines 111 and 121 to match both the phases. With this control, an output timing of the read data DQ output from the data terminal 12 is accurately synchronized with the external clock signals CKT and CKC. Here, when it is assumed that a period from a rising edge of the internal clock signal CK0 to a rising edge of the internal clock signal CK90 is UI0, a period from a rising edge of the internal clock signal CK180 to a rising edge of the internal clock signal CK270 is UI2, a period from a rising edge of the internal clock signal CK90 to a rising edge of the internal clock signal CK180 is UI1, and a period from a rising edge of the internal clock signal CK270 to a rising edge of the internal clock signal CK0 is UI3, the DCA control circuit 200 executes control to satisfy the relation UI0=UI1=UI2=UI3.

Figure 4:
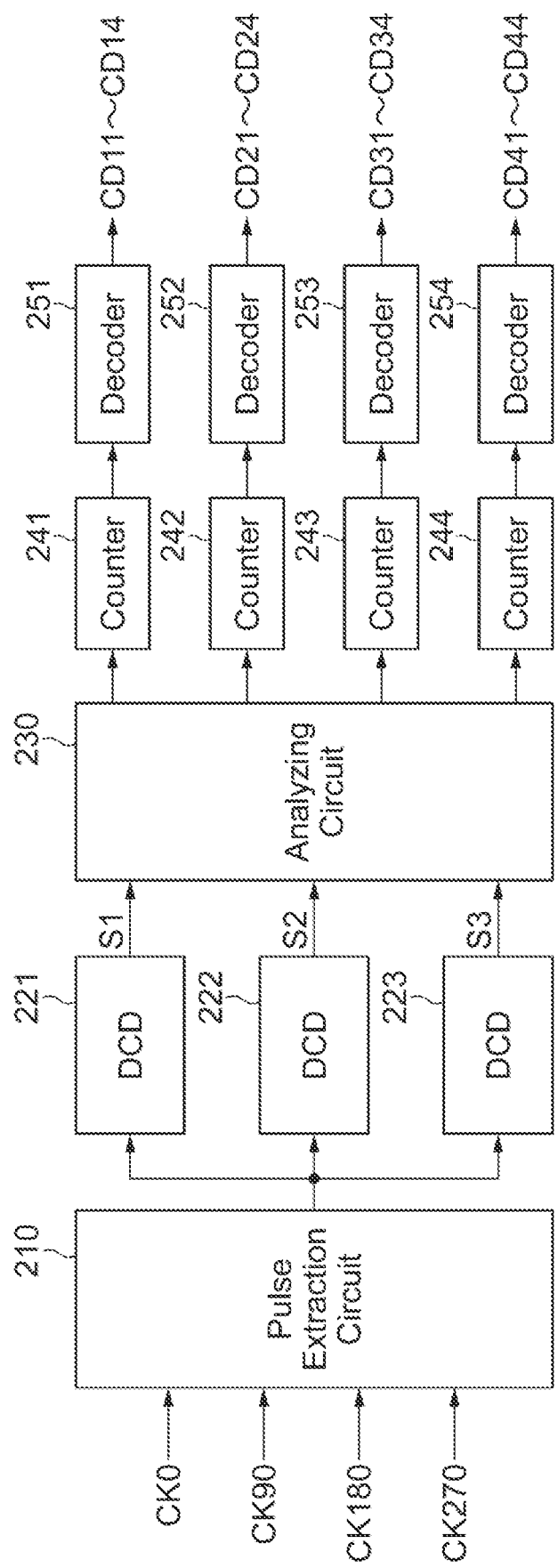
FIG. 4 is a block diagram showing a configuration of a DCA control circuit.
Figure 5:
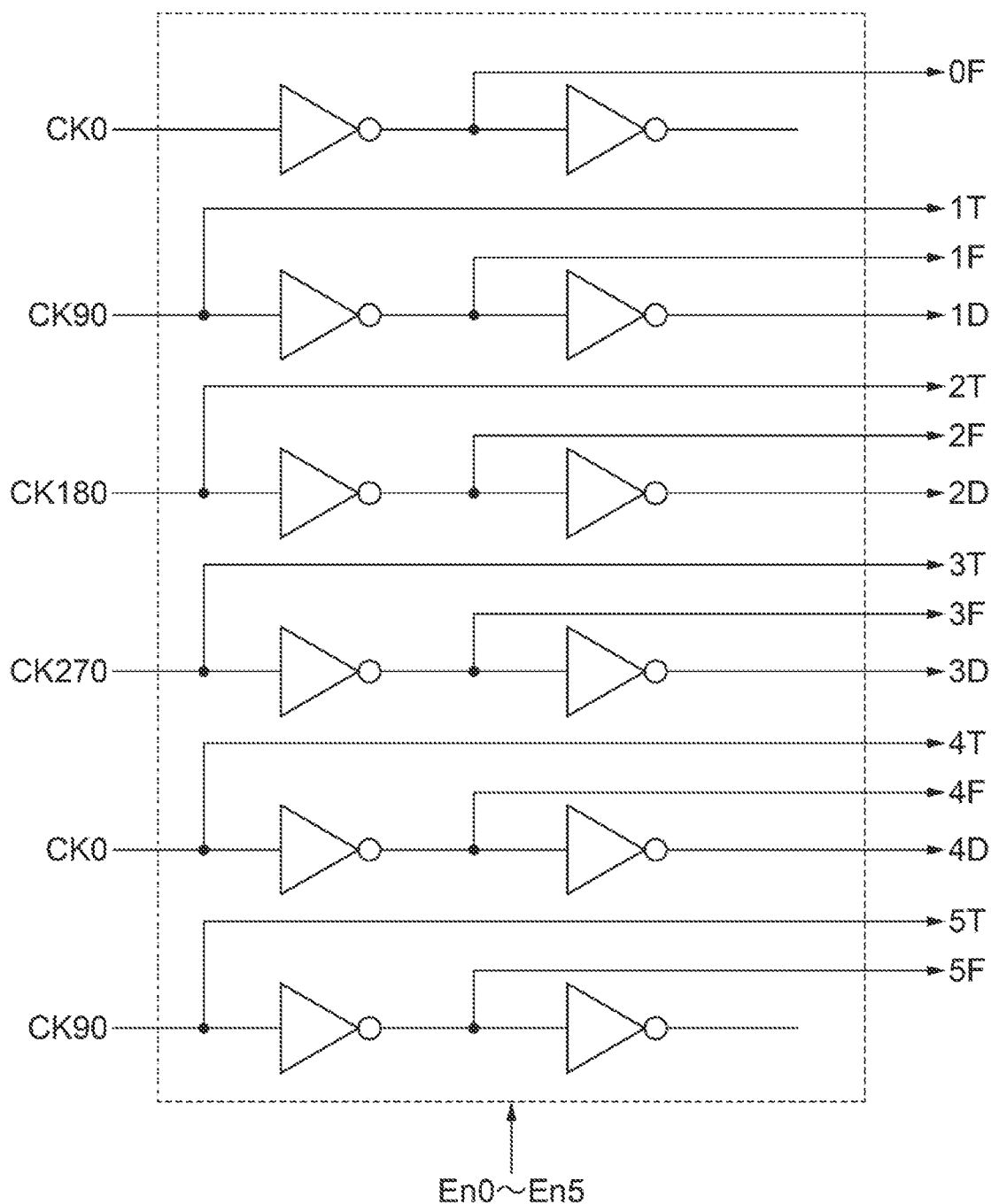
FIG. 5 is a circuit diagram of a pulse extraction circuit.
Figure 6:
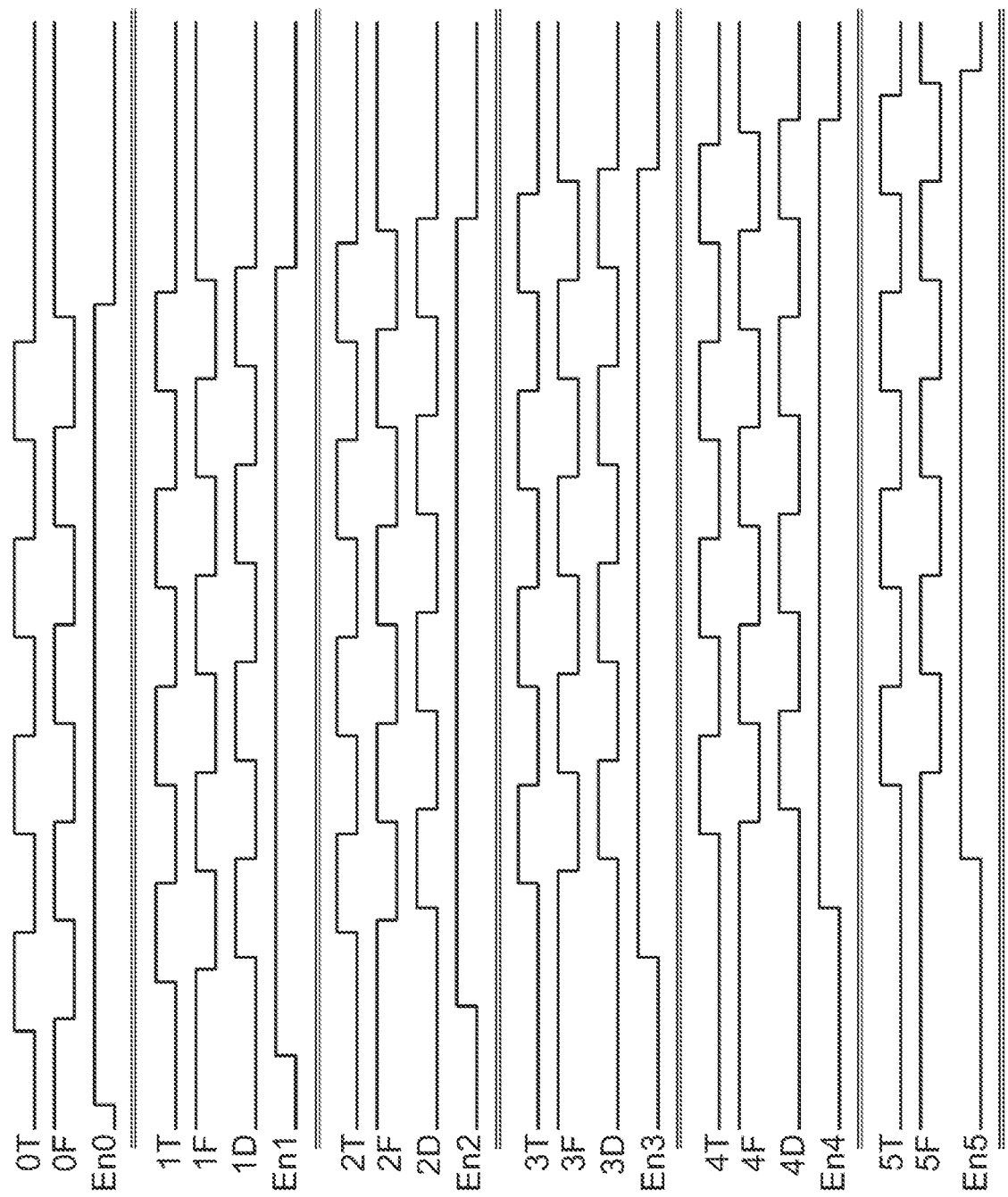
FIG. 6 shows waveforms of control pulses generated by the pulse extraction circuit.

FIG. 4 is a block diagram showing a configuration of the DCA control circuit 200. As shown in FIG. 4, the DCA control circuit 200 includes a pulse extraction circuit 210. As shown in FIG. 5, the pulse extraction circuit 210 generates various control pulses based on the internal clock signals CK0, CK90, CK180, and CK270. FIG. 6 shows waveforms of the control pulses generated by the pulse extraction circuit 210. As shown in FIG. 6, each of the control pulses generated by the pulse extraction circuit 210 has four clock cycles. The number of clock cycles of the control pulse generated by the pulse extraction circuit 210 is not particularly limited as long as it is an even number. As the number of clock cycles of the control pulse is greater, a larger amount of error can be superimposed. Therefore, accurate detection of a small error becomes easy. However, the time required for performing duty check once is increased, so that the time required for locking becomes longer. A control pulse 0F is an inverted signal of an original signal based on the internal clock signal CK0 and is extracted by using an enable signal En0. A control pulse 1T is an original signal based on the internal clock signal CK90, and control pulses 1F and 1D are an inverted signal of the original signal 1T and a signal obtained by delaying the original signal 1T, respectively. All these signals are extracted by using an enable signal En1. A control pulse 2T is an original signal based on the internal clock signal CK180, and control pulses 2F and 2D are an inverted signal of the original signal 2T and a signal obtained by delaying the original signal 2T, respectively. All these signals are extracted by using an enable signal En2. A control pulse 3T is an original signal based on the internal clock signal CK270, and control pulses 3F and 3D are an inverted signal of the original signal 3T and a signal obtained by delaying the original signal 3T, respectively. All these signals are extracted by using an enable signal En3. A control pulse 4T is an original signal based on the internal clock signal CK0, and control pulses 4F and 4D are an inverted signal of the original signal 4T and a signal obtained by delaying the original signal 4T, respectively. All these signals are extracted by using an enable signal En4. A control pulse 5T is an original signal based on the internal clock signal CK90, and a control pulse 5F is an inverted signal of the original signal 5T. Both the signals are extracted by using an enable signal En5. The above-described control pulses are supplied to duty-cycle detectors (DCDs) 221 to 223 included in the DCA control circuit 200.

Figure 7:
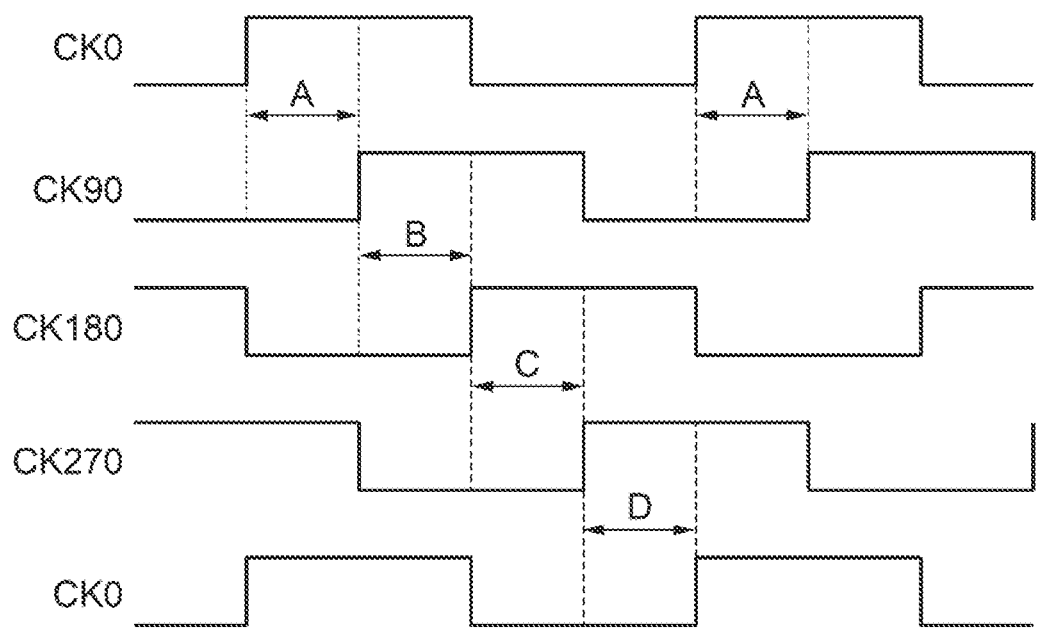
FIG. 7 shows waveforms for explaining a function of a DCD.

The DCDs 221 to 223 detect duty-cycles of the internal clock signals CK0, CK90, CK180, and CK270. Here, as shown in FIG. 7, when it is assumed that a period from a rising edge of the internal clock signal CK0 to a rising edge of the internal clock signal CK90 is A, a period from a rising edge of the internal clock signal CK90 to a rising edge of the internal clock signal CK180 (or a period from a rising edge of the internal clock signal CK90 to a falling edge of the internal clock signal CK0) is B, a period from a rising edge of the internal clock signal CK180 to a rising edge of the internal clock signal CK270 (or a period from a falling edge of the internal clock signal CK0 to a falling edge of the internal clock signal CK90) is C, and a period from a rising edge of the internal clock signal CK270 to a rising edge of the internal clock signal CK0 (or a period from a falling edge of the internal clock signal CK90 to a rising edge of the internal clock signal CK0) is D, the DCD 221 detects a difference between A+B and C+D, the DCD 222 detects a difference between A+D and B+C, and the DCD 223 detects a difference between A+C and B+D. That is, the DCD 221 determines duty-cycles of the internal clock signals CK0 and CK180. The DCD 222 determines duty-cycles of the internal clock signals CK90 and CK270. The DCD 223 determines a phase difference between the internal clock signals CK0 and CK180 and the internal clock signals CK90 and CK270.

Figure 8A:
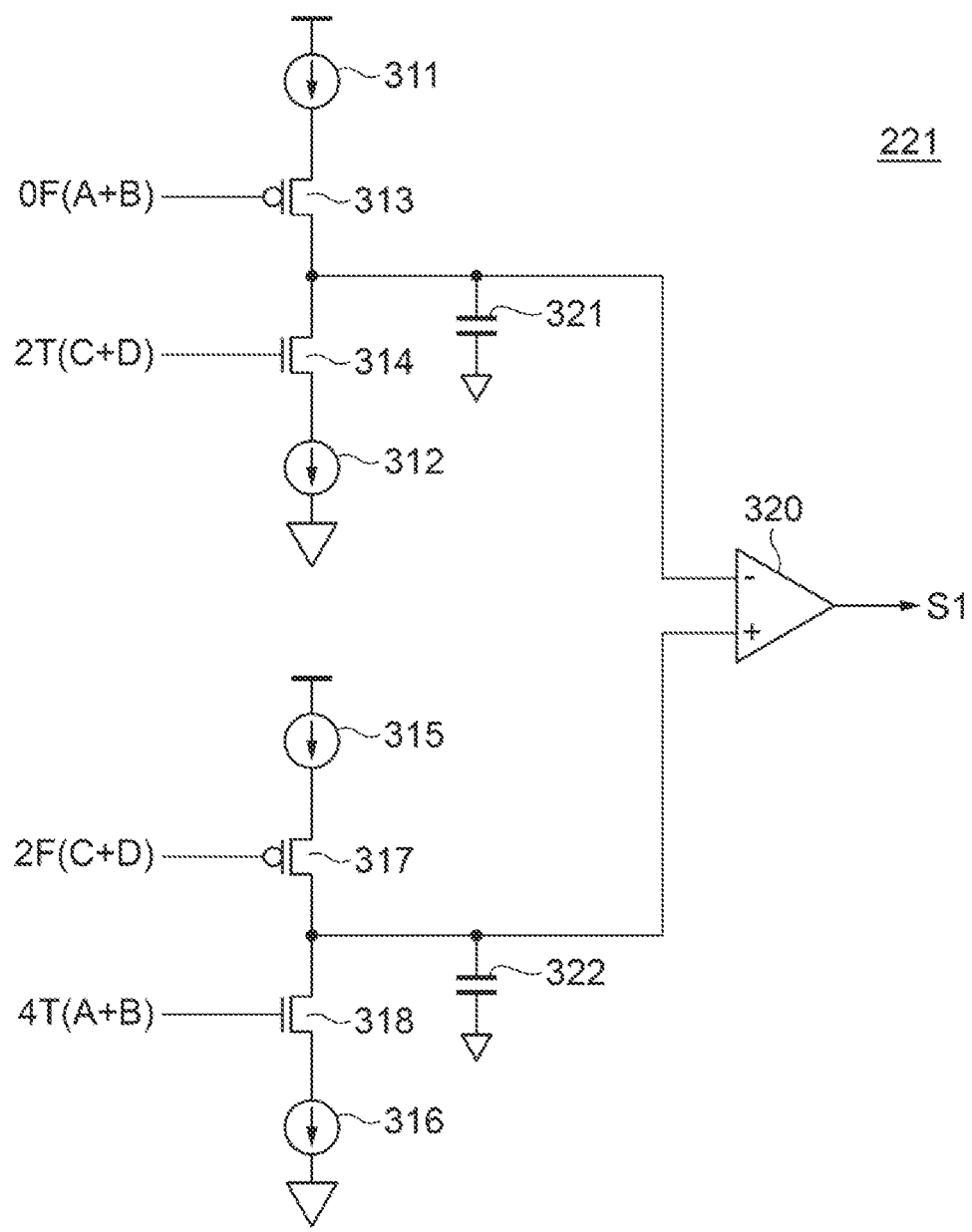
FIGS. 8A to 8C are circuit diagrams of DCDs.
Figure 9A:
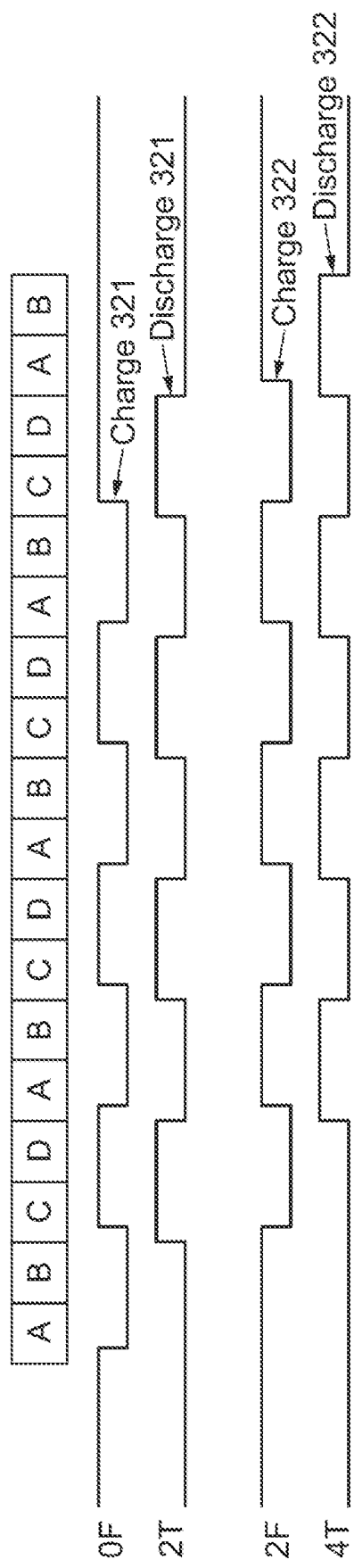
FIGS. 9A to 9C are waveforms for explaining functions of the DCDs.

FIG. 8A is a circuit diagram of the DCD 221. As shown in FIG. 8A, the DCD 221 includes a P-channel MOS transistor 313 and an N-channel MOS transistor 314 connected in series between current sources 311 and 312 and a P-channel MOS transistor 317 and an N-channel MOS transistor 318 connected in series between current sources 315 and 316. The control pulse 0F is input to a gate electrode of the transistor 313, and accordingly the transistor 313 is turned on in a period of A+B. The control pulse 2T is input to a gate electrode of the transistor 314, and accordingly the transistor 314 is turned on in a period of C+D. The control pulse 2F is input to a gate electrode of the transistor 317, and accordingly the transistor 317 is turned on in a period of C+D. The control pulse 4T is input to a gate electrode of the transistor 318, and accordingly the transistor 318 is turned on in a period of A+B. A connection point between the transistors 313 and 314 is connected to a capacitor 321. With this configuration, as shown in FIG. 9A, the capacitor 321 is charged when the transistor 313 is turned on, and is discharged when the transistor 314 is turned on. A connection point between the transistors 317 and 318 is connected to a capacitor 322. With this configuration, as shown in FIG. 9A, the capacitor 322 is charged when the transistor 317 is turned on, and is discharged when the transistor 318 is turned on. A potential difference between the capacitors 321 and 322 is detected by a comparator 320, based on which a detection signal S1 is generated. With this configuration, the DCD 221 places the detection signal S1 at a low level when A+B is longer than C+D, and places the detection signal S1 at a high level when A+B is shorter than C+D.

Figure 8B:
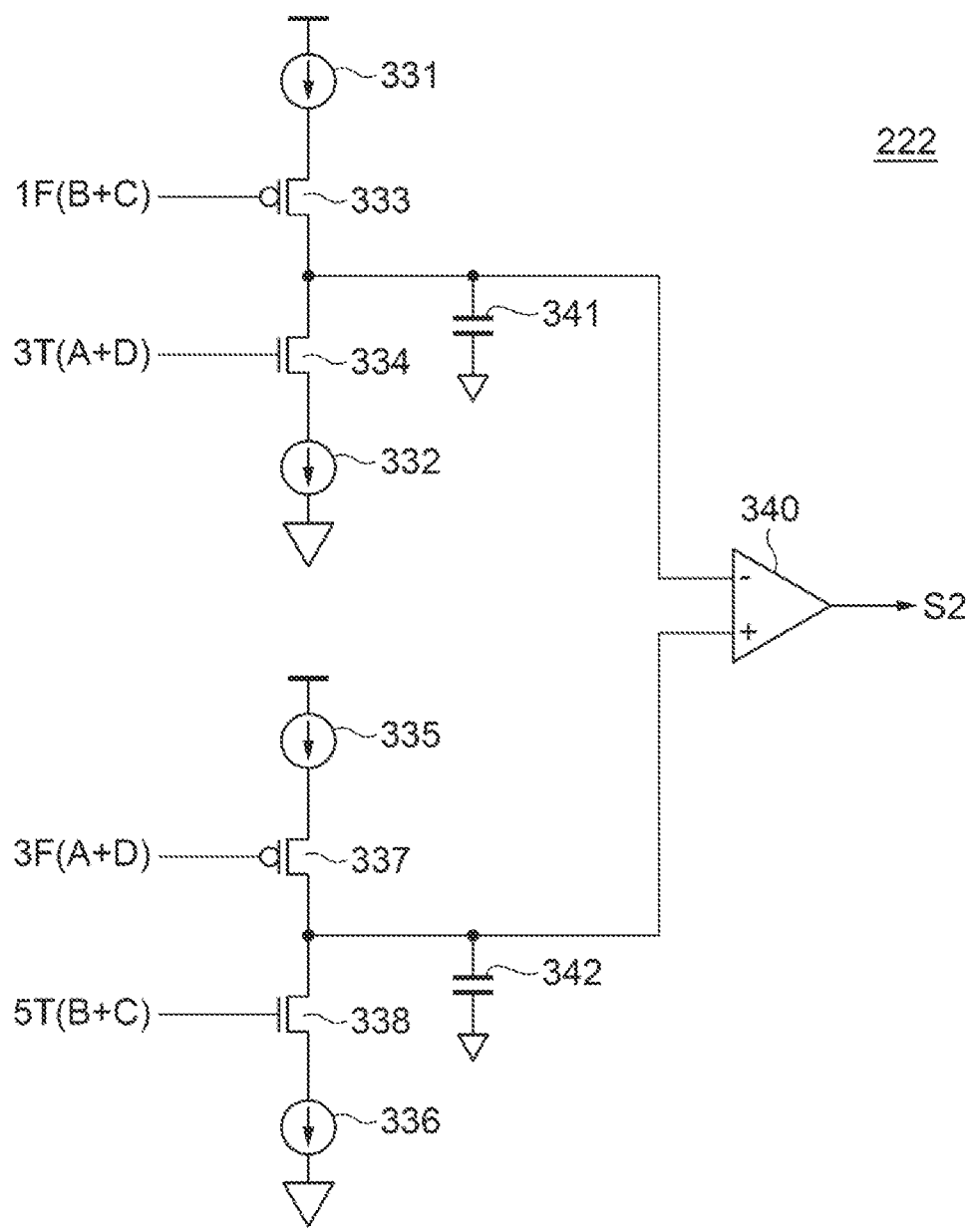
Figure 9B:
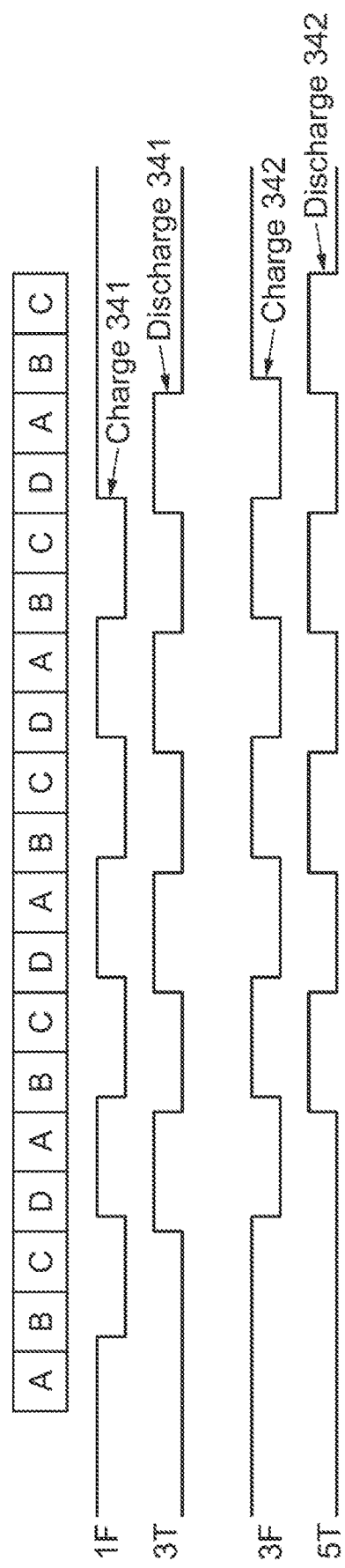

FIG. 8B is a circuit diagram of the DCD 222. As shown in FIG. 8B, the DCD 222 includes a P-channel MOS transistor 333 and an N-channel MOS transistor 334 connected in series between current sources 331 and 332 and a P-channel MOS transistor 337 and an N-channel MOS transistor 338 connected in series between current sources 335 and 336. The control pulse 1F is input to a gate electrode of the transistor 333, and accordingly the transistor 333 is turned on in a period of B+C. The control pulse 3T is input to a gate electrode of the transistor 334, and accordingly the transistor 334 is turned on in a period of A+D. The control pulse 3F is input to a gate electrode of the transistor 337, and accordingly the transistor 337 is turned on in a period of A+D. The control pulse 5T is input to a gate electrode of the transistor 338, and accordingly the transistor 338 is turned on in a period of B+C. A connection point between the transistors 333 and 334 is connected to a capacitor 341. With this configuration, as shown in FIG. 9B, the capacitor 341 is charged when the transistor 333 is turned on, and is discharged when the transistor 334 is turned on. A connection point between the transistors 337 and 338 is connected to a capacitor 342. With this configuration, as shown in FIG. 9B, the capacitor 342 is charged when the transistor 337 is turned on, and is discharged when the transistor 338 is turned on. A potential difference between the capacitors 341 and 342 is detected by a comparator 340, based on which a detection signal S2 is generated. With this configuration, the DCD 222 places the detection signal S2 at a low level when B+C is longer than A+D, and places the detection signal S2 at a high level when B+C is shorter than A+D.

Figure 8C:
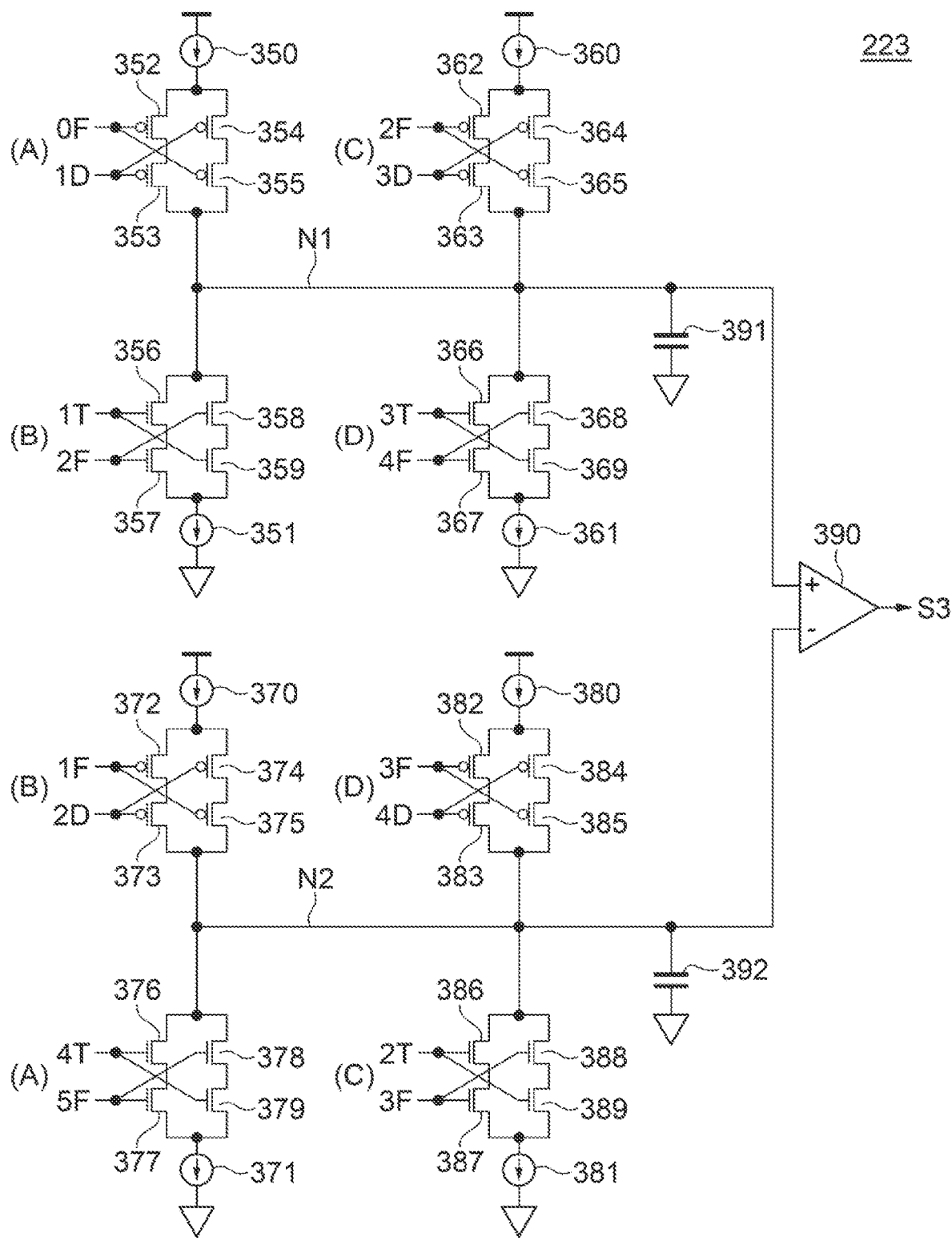

FIG. 8C is a circuit diagram of the DCD 223. As shown in FIG. 8C, the DCD 223 includes between a current source 350 and a node N1 P-channel MOS transistors 352 and 353 connected in series and P-channel MOS transistors 354 and 355 connected in series and also includes between a current source 360 and the node N1 P-channel MOS transistors 362 and 363 connected in series and P-channel MOS transistors 364 and 365 connected in series. The control pulse 0F is input to gate electrodes of the transistors 352 and 355, the control pulse 1D is input to gate electrodes of the transistors 353 and 354, the control pulse 2F is input to gate electrodes of the transistors 362 and 365, and the control pulse 3D is input to gate electrodes of the transistors 363 and 364. The DCD 223 further includes between the node N1 and a current source 351 N-channel MOS transistors 356 and 357 connected in series and N-channel MOS transistors 358 and 359 connected in series and also includes between the node N1 and a current source 361 N-channel MOS transistors 366 and 367 connected in series and N-channel MOS transistors 368 and 369 connected in series. The control pulse 1T is input to gate electrodes of the transistors 356 and 359, the control pulse 2F is input to gate electrodes of the transistors 357 and 358, the control pulse 3T is input to gate electrodes of the transistors 366 and 369, and the control pulse 4F is input to gate electrodes of the transistors 367 and 368.

The DCD 223 includes between a current source 370 and a node N2 P-channel MOS transistors 372 and 373 connected in series and P-channel MOS transistors 374 and 375 connected in series and also includes between a current source 380 and the node N2 P-channel MOS transistors 382 and 383 connected in series and P-channel MOS transistors 384 and 385 connected in series. The control pulse 1F is input to gate electrodes of the transistors 372 and 375, the control pulse 2D is input to gate electrodes of the transistors 373 and 374, the control pulse 3F is input to gate electrodes of the transistors 382 and 385, and the control pulse 4D is input to gate electrodes of the transistors 383 and 384. The DCD 223 further includes between the node N2 and a current source 371 N-channel MOS transistors 376 and 377 connected in series and N-channel MOS transistors 378 and 379 connected in series and also includes between the node N2 and a current source 381 N-channel MOS transistors 386 and 387 connected in series and N-channel MOS transistors 388 and 389 connected in series. The control pulse 4T is input to gate electrodes of the transistors 376 and 379, the control pulse 5F is input to gate electrodes of the transistors 377 and 378, the control pulse 2T is input to gate electrodes of the transistors 386 and 389, and the control pulse 3F is input to gate electrodes of the transistors 387 and 388.

Figure 9C:
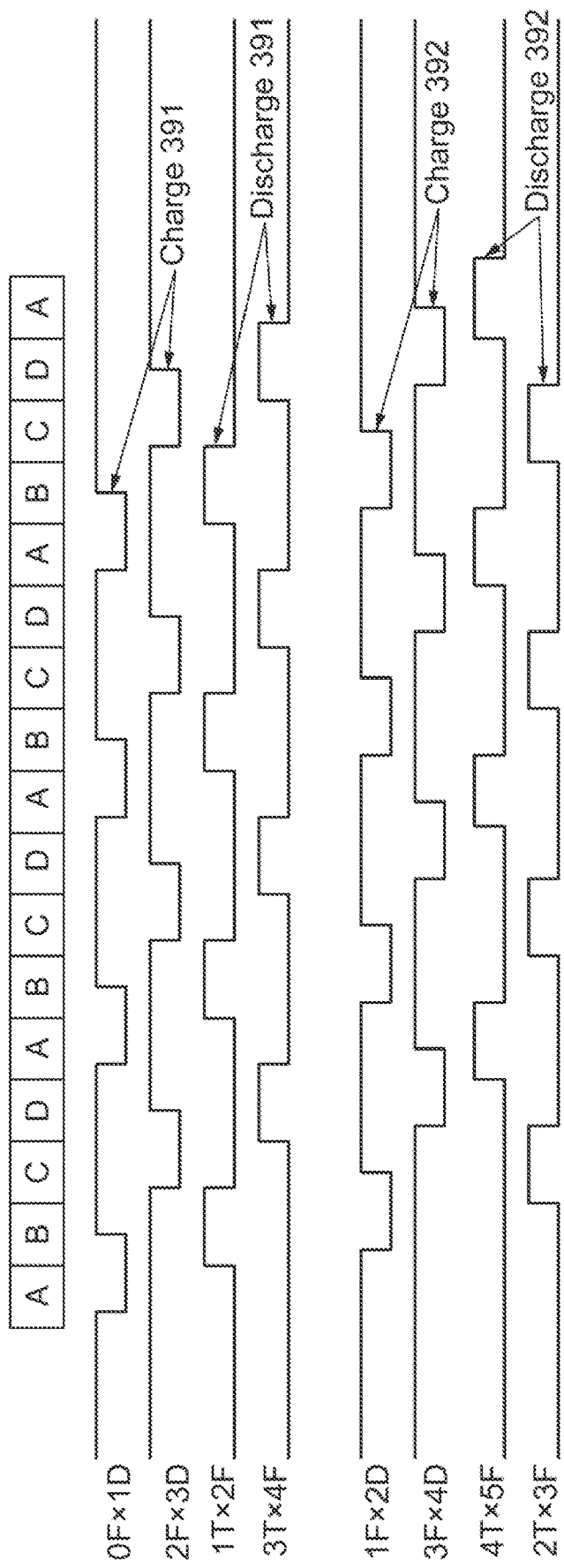

The node N1 is connected to a capacitor 391. With this configuration, as shown in FIG. 9C, the capacitor 391 is charged when the transistors 352 to 355 or 362 to 365 are turned on, and is discharged when the transistor 356 to 359 or 366 to 369 are turned on. The node N2 is connected to a capacitor 392. With this configuration, as shown in FIG. 9C, the capacitor 392 is charged when the transistors 372 to 375 or 382 to 385 are turned on, and is discharged when the transistor 376 to 379 or 386 to 389 are turned on. A potential difference between the capacitors 391 and 392 is detected by a comparator 390, based on which a detection signal S3 is generated. With this configuration, the DCD 223 places the detection signal S3 at a high level when A+C is longer than B+D, and places the detection signal S3 at a low level when A+C is shorter than B+D.

As shown in FIG. 4, the detection signals S1 to S3 are supplied to an analyzing circuit 230 included in the DCA control circuit 200. The analyzing circuit 230 analyzes the detection signals S1 to S3, thereby incrementing or decrementing count values of counters 241 to 244. The count values of the counters 241 and 242 are parameters for controlling a rising edge and a falling edge of the divided clock signal iCK0, respectively. The count values of the counters 243 and 244 are parameters for controlling a rising edge and a falling edge of the divided clock signal iCK90, respectively. All the counters 241 to 244 execute control in such a manner that as the count value is increased, the corresponding edge is delayed. Default values of the counters 241 to 244 are 0, and therefore delays of all the edges are minimum in the initial state.

FIG. 10 is an explanatory diagram of an operation of the analyzing circuit 230. As described above, the three-bit detection signals S1 to S3 are supplied to the analyzing circuit 230 from the DCDs 221 to 223. Therefore, eight combinations of the detection signals S1 to S3 are possible. When Pattern #1 in which the detection signals S1 and S3 are at a low level and the detection signal S2 is at a high level appears, it is found that the period A is longer than the other periods B, C, and D. In this case, therefore, control for shortening the period A is required. To this end, it suffices that a rising edge of the divided clock signal iCK0 is delayed or a rising edge of the divided clock signal iCK90 is advanced. In this regard, the analyzing circuit 230 increments the counter 241 or decrements the counter 243. When Pattern #2 in which the detection signal S1 is at a low level and the detection signals S2 and S3 are at a high level appears, it is found that the period C is shorter than the other periods A, B, and D. In this case, therefore, control for making the period C longer is required. To this end, it suffices that a falling edge of the divided clock signal iCK90 is delayed or a falling edge of the divided clock signal iCK0 is advanced. In this regard, the analyzing circuit 230 increments the counter 244 or decrements the counter 242. When Pattern #3 in which all the detection signals S1 to S3 are at a low level appears, it is found that the period D is shorter than the other periods A, B, and C. In this case, therefore, control for making the period D longer is required. To this end, it suffices that a rising edge of the divided clock signal iCK0 is delayed or a falling edge of the divided clock signal iCK90 is advanced. In this regard, the analyzing circuit 230 increments the counter 241 or decrements the counter 244. When Pattern #4 in which the detection signals S1 and S2 are at a low level and the detection signal S3 is at a high level appears, it is found that the period B is longer than other the periods A, C, and D. In this case, therefore, control for shortening the period B is required. To this end, it suffices that a rising edge of the divided clock signal iCK90 is delayed or a falling edge of the divided clock signal iCK0 is advanced. In this regard, the analyzing circuit 230 increments the counter 243 or decrements the counter 242.

When Pattern #5 in which the detection signals S1 and S2 are at a high level and the detection signal S3 is at a low level appears, it is found that the period B is shorter than the other periods A, C, and D. In this case, therefore, control for making the period B longer is required. To this end, it suffices that a falling edge of the divided clock signal iCK0 is delayed or a rising edge of the divided clock signal iCK90 is advanced. In this regard, the analyzing circuit 230 increments the counter 242 or decrements the counter 243. When Pattern #6 in which all the detection signals S1 to S3 are at a high level appears, it is found that the period D is longer than the other periods A, B, and C. In this case, therefore, control for shortening the period D is required. To this end, it suffices that a falling edge of the divided clock signal iCK90 is delayed or a rising edge of the divided clock signal iCK0 is advanced. In this regard, the analyzing circuit 230 increments the counter 244 or decrements the counter 241. When Pattern #7 in which the detection signal S1 is at a high level and the detection signals S2 and S3 are at a low level appears, it is found that the period C is longer than the other periods A, B, and D. In this case, therefore, control for shortening the period C is required. To this end, it suffices that a falling edge of the divided clock signal iCK0 is delayed or a falling edge of the divided clock signal iCK90 is advanced. In this regard, the analyzing circuit 230 increments the counter 242 or decrements the counter 244. When Pattern #8 in which the detection signals S1 and S3 are at a high level and the detection signal S2 is at a low level appears, it is found that the period A is shorter than the other periods B, C, and D. In this case, therefore, control for making the period A longer is required. To this end, it suffices that a rising edge of the divided clock signal iCK90 is delayed or a rising edge of the divided clock signal iCK0 is advanced. In this regard, the analyzing circuit 230 increments the counter 243 or decrements the counter 241.

In accordance with the appearing Patterns #1 to #8, the analyzing circuit 230 increments or decrements the counters 241 to 244 in this manner. Incrementing the counters 241 to 244 is usually selected, although not specifically limited. When all the count values of the counters 241 to 244 are not zero, decrementing the counters 241 to 244 may be selected. When the analyzing circuit 230 increments or decrements a required one of the counters 241 to 244 in this manner, the duty-cycles of the divided clock signals iCK0 and iCK90 become closer to 50%, and the phase difference between the divided clock signals iCK0 and iCK90 becomes closer to 90 degrees. When the phase difference between the divided clock signals iCK0 and iCK90 becomes 90 degrees, the phase differences between the internal clock signals CK0, CK90, CK180, and CK270 also become 90 degrees. In the present embodiment, control is executed in such a manner that the duty-cycles of the divided clock signals iCK0 and iCK90 become 50%. Therefore, the lengths of the periods UI0 to UI3 shown in FIG. 3 also become uniform. The periods UI0 to UI3 correspond to the above-described periods A to D, respectively.

Figure 12:
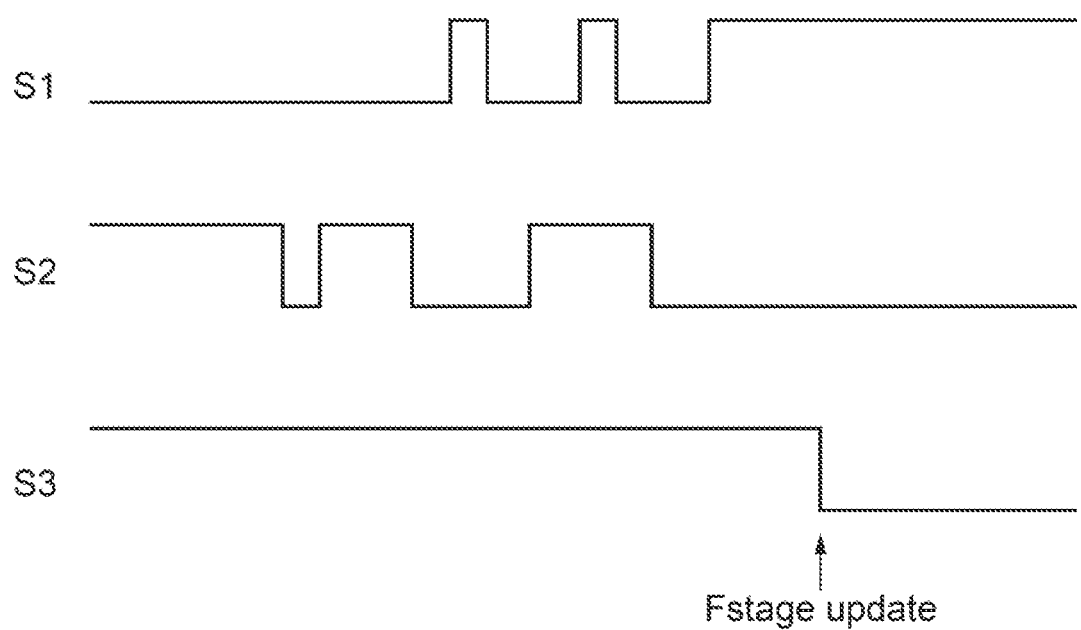
FIG. 12 is a waveform showing an example of a change of a detection signal.

The counters 241 to 244 may be incremented or decremented by one step. However, a control stage in which the counters 241 to 244 are updated by multiple steps and a control stage in which the counters 241 to 244 are updated by one step may be performed in turn. In examples shown in FIGS. 11A to 11C, for example, a control stage Fstage 1 in which the counters 241 to 244 are updated by four steps (or eight steps), a control stage Fstage 2 in which the counters 241 to 244 are updated by two steps, and control stages Fstages 3 and 4 in which the counters 241 to 244 are updated by one step are executed in this order. The control stage may be updated to the next control stage when transitions of levels of all the detection signals S1 to S3 from the DCDs 221 to 223 have occurred. In a case where the detection signals S1 to S3 change as the example shown in FIG. 12, for example, the control stage may be updated in response to the last changed detection signal S3. Further, in a case where one or two of the detection signals S1 to S3 do not change and only the remaining detection signal(s) change/changes repeatedly, the control stage may be updated forcibly. In addition, transition to the control stage Fstage 3 may be prohibited before completion of an initializing operation of a DLL circuit using the path control circuit 130. In the case shown in FIG. 11A, the initializing operation of the DLL circuit is performed in the course of the control stage Fstage 2. In this regard, when the initializing operation of the DLL circuit ends, the control stage Fstage 2 is resumed. In the cases shown in FIGS. 11B and 11C, the initializing operation of the DLL circuit is performed in the course of the control stage Fstage 1. In this regard, when the initializing operation of the DLL circuit ends, the control stage Fstage 1 may be resumed as shown in FIG. 11B or may be transitioned to the control stage Fstage 2 as shown in FIG. 11C.

Figure 13:
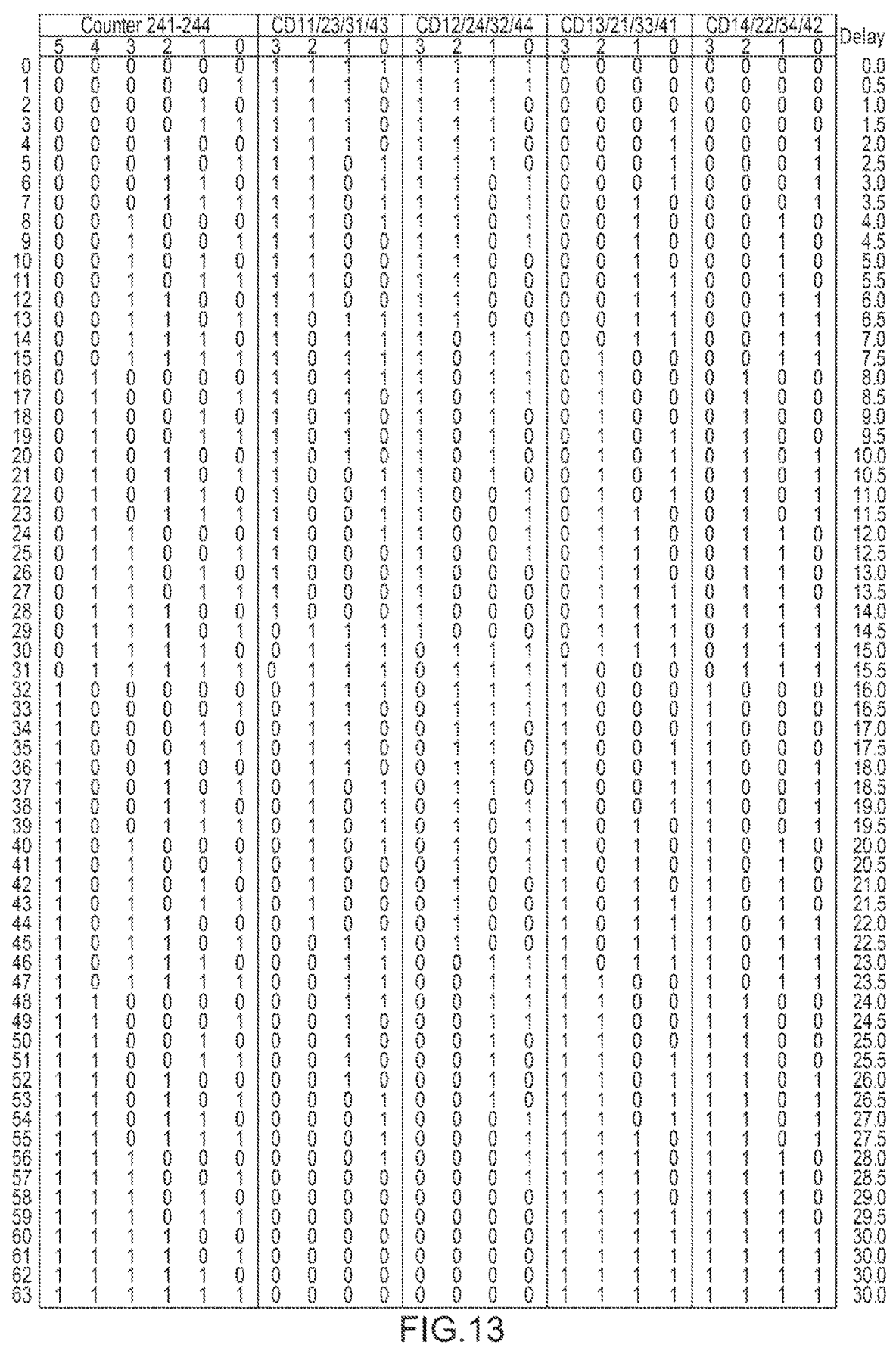

The count values of the counters 241 to 244 generated in this manner are supplied to decoders 251 to 254, respectively, as shown in FIG. 4. The decoder 251 generates control codes CD11 to CD14 by decoding the count value of the counter 241. The decoder 252 generates control codes CD21 to CD24 by decoding the count value of the counter 242. The decoder 253 generates control codes CD31 to CD34 by decoding the count value of the counter 243. The decoder 253 generates control codes CD41 to CD44 by decoding the count value of the counter 243. A relation between the count values of the counters 241 to 244 and the control codes CD11 to CD14, CD 21 to CD24, CD31 to CD34, and CD41 to CD44 is shown in FIG. 13. The control codes CD11 to CD14 and CD 21 to CD24 are supplied to the DCA 112, and the control codes CD31 to CD34 and CD 41 to CD44 are supplied to the DCA 122.

Figure 14A:
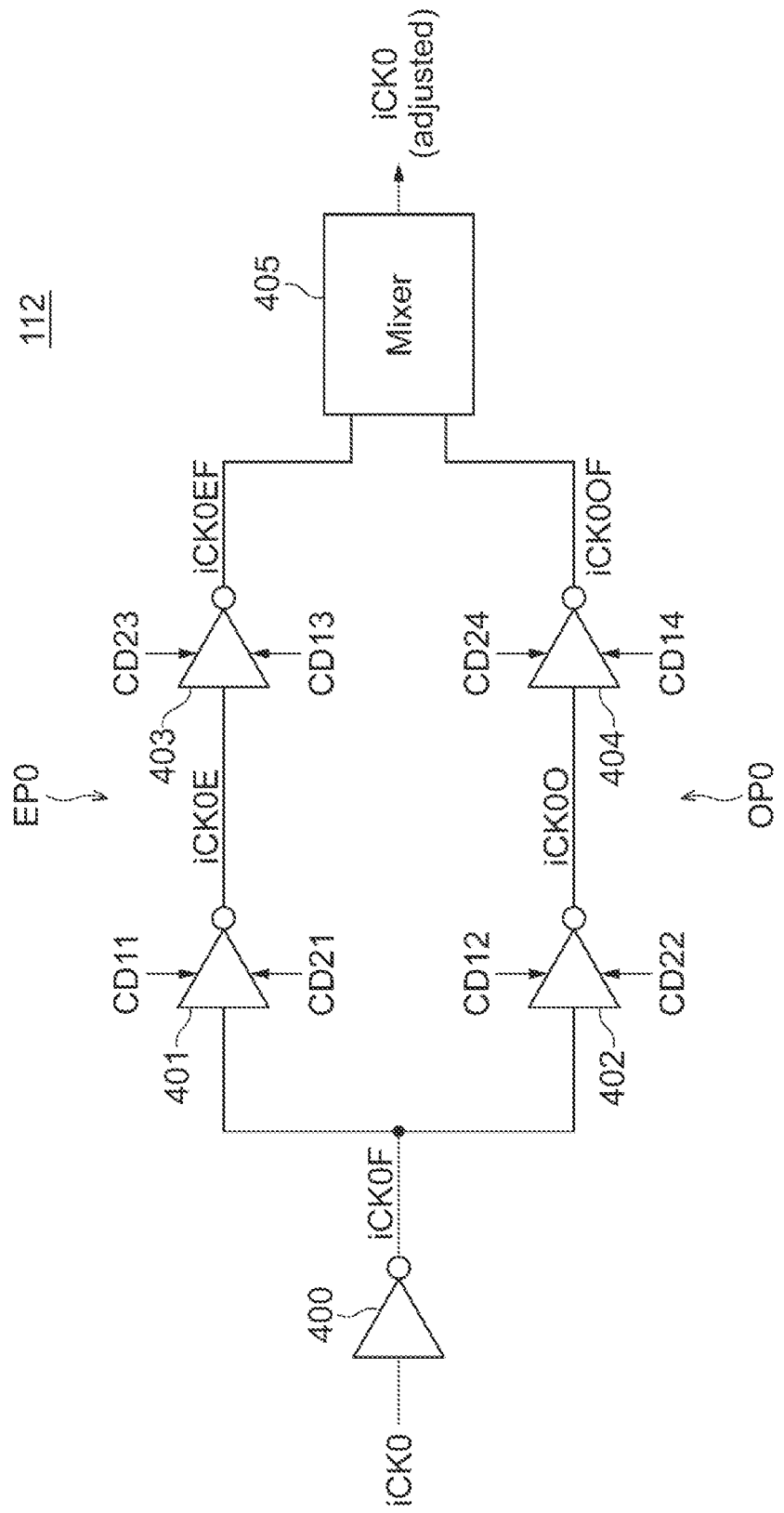
FIGS. 14A and 14B are circuit diagrams of a DCA.

FIG. 14A is a circuit diagram of the DCA 112. The DCA 112 includes an inverter 400 that inverts the divided clock signal iCK0 to generate a divided clock signal iCK0F and an even-path EP0 and an odd-path OP0 that receive the divided clock signal iCK0F. The even-path EP0 includes inverters 401 and 403 connected in series. The odd-path OP0 includes inverters 402 and 404 connected in series. The pull-up capability of the inverters 401 to 404 can be adjusted by the control codes CD11, CD12, CD23, and CD24, respectively. The pull-down capability of the inverters 401 to 404 can be adjusted by the control codes CD21, CD22, CD13, and CD14, respectively. A divided clock signal iCK0EF output from the even-path EP0 and a divided clock signal iCK0OF output from the odd-path OP0 are input to a mixer 405. The mixer 405 synthesizes the divided clock signals iCK0EF and iCK0OF at a mixing ratio of 50%, thereby reproducing the divided clock signal iCK0 with adjusted timings. The mixing ratio of the mixer 405 is fixed to 50%.

Figure 15:
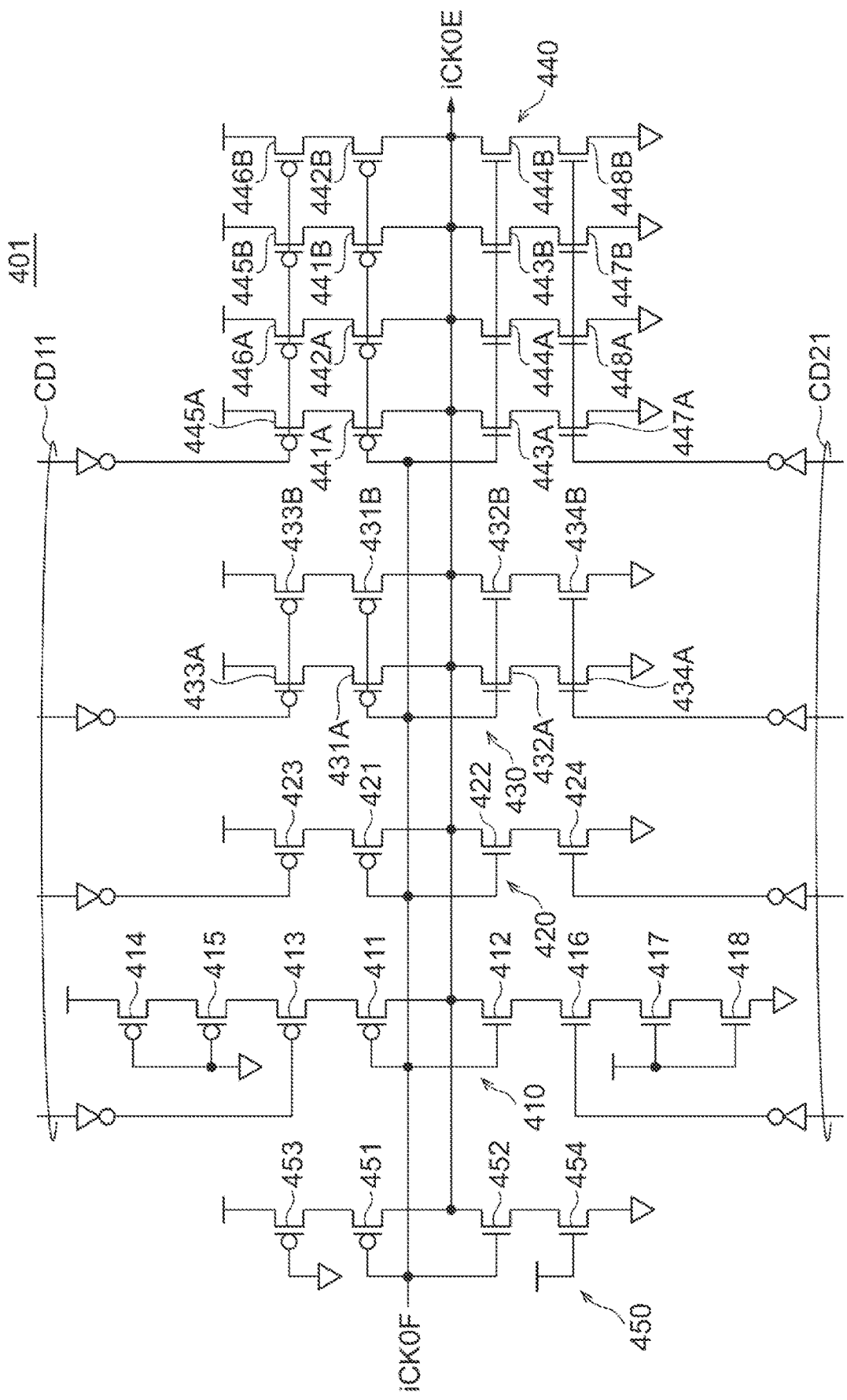
FIG. 15 is a circuit diagram of an inverter included in the DCA.

FIG. 15 is a circuit diagram of the inverter 401. As shown in FIG. 15, the inverter 401 includes five inverters 410, 420, 430, 440, and 450 connected in parallel. The inverter 410 includes a P-channel MOS transistor 411 and an N-channel MOS transistor 412 each having a gate electrode to which the divided clock signal iCK0F is supplied, P-channel MOS transistors 413 to 415 connected in series between a higher-potential power line and the transistor 411, and N-channel MOS transistors 416 to 418 connected in series between a lower-potential power line and the transistor 412. An inverted signal of the least significant bit of the control code CD11 is supplied to a gate electrode of the transistor 413. An inverted signal of the least significant bit of the control code CD21 is supplied to a gate electrode of the transistor 416. A ground potential is supplied to gate electrodes of the transistors 414 and 415, whereby the transistors 414 and 415 are always in an ON-state. A power potential is supplied to gate electrodes of the transistors 417 and 418, whereby the transistors 417 and 418 are always in an ON-state. The inverter 420 includes a P-channel MOS transistor 421 and an N-channel MOS transistor 422 each having a gate electrode to which the divided clock signal iCK0F is supplied, a P-channel MOS transistor 423 connected between the higher-potential power line and the transistor 421, and an N-channel MOS transistor 424 connected between the lower-potential power line and the transistor 422. An inverted signal of the second bit of the control code CD11 is supplied to a gate electrode of the transistor 423. An inverted signal of the second bit of the control code CD21 is supplied to a gate electrode of the transistor 424. This configuration makes the drive capability of the inverter 420 two times higher than the drive capability of the inverter 410.

The inverter 430 includes P-channel MOS transistors 431A and 431B and N-channel MOS transistors 432A and 432B, each having a gate electrode to which the divided clock signal iCK0F is supplied, P-channel MOS transistor 433A and 433B connected between the higher-potential power line and the transistors 431A and 431B, respectively, and N-channel MOS transistor 434A and 434B connected between the lower-potential power line and the transistors 432A and 432B, respectively. An inverted signal of the third bit of the control code CD11 is supplied to gate electrodes of the transistors 433A and 433B. An inverted signal of the third bit of the control code CD21 is supplied to gate electrodes of the transistors 434A and 434B. This configuration makes the drive capability of the inverter 430 two times higher than the drive capability of the inverter 420. The inverter 440 includes P-channel MOS transistors 441A, 442A, 441B, and 442B and N-channel MOS transistors 443A, 444A, 443B, and 444B, each having a gate electrode to which the divided clock signal iCK0F is supplied, P-channel MOS transistor 445A, 446A, 445B, and 446B connected between the higher-potential power line and the transistors 441A, 442A, 441B, and 442B, respectively, and N-channel MOS transistors 447A, 448A, 447B, and 448B connected between the lower-potential power line and the transistors 443A, 444A, 443B, and 444B, respectively. An inverted signal of the most significant bit of the control code CD11 is supplied to gate electrodes of the transistors 445A, 446A, 445B, and 446B. An inverted signal of the most significant bit of the control code CD21 is supplied to gate electrodes of the transistors 447A, 448A, 447B, and 448B. This configuration makes the drive capability of the inverter 440 two times higher than the drive capability of the inverter 430.

With this configuration, the inverter 401 can change the pull-up capability in 16 stages based on the four-bit control code CD11 and can also change the pull-down capability in 16 stages based on the four-bit control code CD21. The inverter 450 includes a P-channel MOS transistor 451 and an N-channel MOS transistor 452 each having a gate electrode to which the divided clock signal iCK0F is supplied, a P-channel MOS transistor 453 connected between the higher-potential power line and the transistor 451, and an N-channel MOS transistor 454 connected between the lower-potential power line and the transistor 452. The ground potential is supplied to a gate electrode of the transistor 453, whereby the transistor 453 is always in an ON-state. The power potential is supplied to a gate electrode of the transistor 454, whereby the transistor 454 is always in an ON-state. Accordingly, the inverter 450 operates irrespective of the control codes CD11 and CD21.

The other inverters 402 to 404 also have a circuit configuration identical to that of the inverter 401. Accordingly, the inverter 402 can change the pull-up capability in 16 stages based on the four-bit control code CD12 and can also change the pull-down capability in 16 stages based on the four-bit control code CD22. The inverter 403 can change the pull-down capability in 16 stages based on the four-bit control code CD13 and can also change the pull-up capability in 16 stages based on the four-bit control code CD23. The inverter 404 can change the pull-down capability in 16 stages based on the four-bit control code CD14 and can also change the pull-up capability in 16 stages based on the four-bit control code CD24.

Figure 14B:
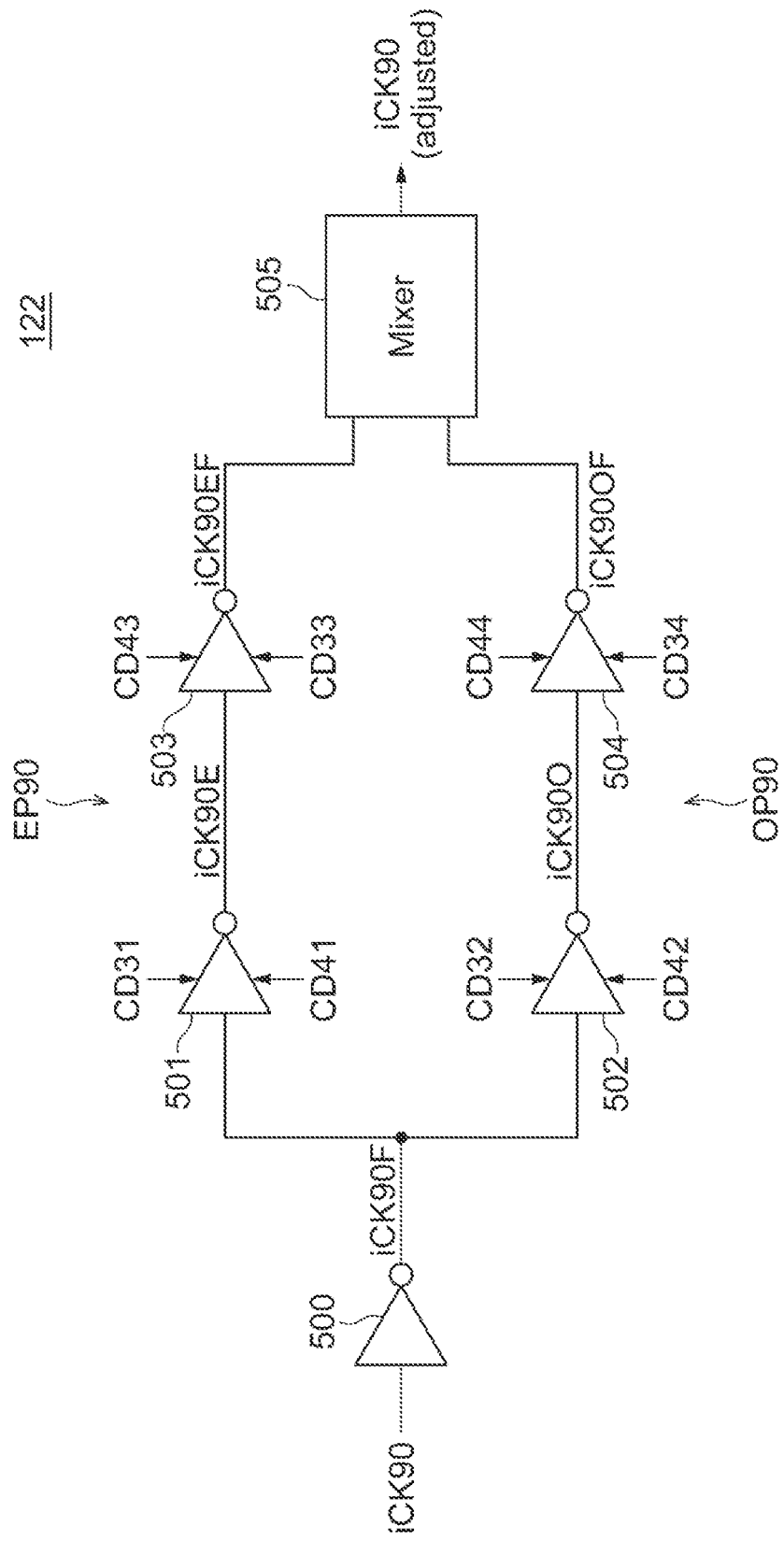

As shown in FIG. 14B, the DCA 122 has a circuit configuration identical to that of the DCA 112. The DCA 122 includes an inverter 500 that inverts the divided clock signal iCK90 to generate a divided clock signal iCK90F and an even-path E90 and an odd-path OP90 that receive the divided clock signal iCK90F. The even-path EP90 includes inverters 501 and 503 connected in series. The odd-path OP90 includes inverters 502 and 504 connected in series. The pull-up capability of the inverters 501 to 504 can be adjusted by the control codes CD31, CD32, CD43, and CD44, respectively. The pull-down capability of the inverters 501 to 504 can be adjusted by the control codes CD41, CD42, CD33, and CD34, respectively. A divided clock signal iCK90EF output from the even-path EP90 and a divided clock signal iCK90OF output from the odd-path OP90 are input to a mixer 505. The mixer 505 synthesizes the divided clock signals iCK90EF and iCK90OF at a mixing ratio of 50%, thereby reproducing the divided clock signal iCK90 with adjusted timings. The mixing ratio of the mixer 505 is fixed to 50%.

As shown in FIG. 13, when the count values of the counters 241 to 244 are default values (=0), the pull-up capability and the pull-down capability of the inverters 401 to 404 included in the DCA 112 and those of the inverters 501 to 504 included in the DCA 122 become the maximum. Accordingly, delays of rising edges and falling edges of the divided clock signals iCK0 and iCK90 become the minimum. When any of the counters 241 to 244 is incremented, the pull-up capability or the pull-down capability of a corresponding one of the inverters 401 to 404 and 501 to 504 is lowered, and the delay of the rising edge or the falling edge of the corresponding divided clock signal iCK0 or iCK90 is increased.

In one example, when the count value of the counter 241 is incremented from 0 as the default value to 1, the control code CD11 is decreased by one bit, so that the pull-up capability of the inverter 401 is lowered by one step. Accordingly, the rising edge of the divided clock signal iCK0 is delayed in the even-path EP0 by one step. As a result, the divided clock signal iCK0EF in which a falling edge is delayed from the minimum value by one step and the divided clock signal iCK0OF in which a falling edge is the minimum value are input to the mixer 405, and are synthesized at a mixing ratio of 50%. Consequently, the divided clock signal iCK0 output from the DCA 112 has a waveform in which a rising edge is delayed by 0.5 steps.

Further, when the count value of the counter 241 is incremented from 1 to 2, the control code CD12 is further decreased by one bit, so that the pull-up capability of the inverter 402 is lowered by one step. Accordingly, the rising edge of the divided clock signal iCK0 is delayed in each of the even-path EP0 and the odd-path OP0 by one step. As a result, the divided clock signal iCK0EF in which the falling edge is delayed from the minimum value by one step and the divided clock signal iCK0OF in which the falling edge is delayed from the minimum value by one step are input to the mixer 405, and are synthesized at a mixing ratio of 50%. Consequently, the divided clock signal iCK0 output from the DCA 112 has a waveform in which the rising edge is delayed by one step.

Furthermore, when the count value of the counter 241 is incremented from 2 to 3, the control code CD13 is further increased by one bit, so that the pull-down capability of the inverter 403 is lowered by one step. Accordingly, the rising edge of the divided clock signal iCK0 is delayed in the even-path EP0 by two steps and in the odd-path OP0 by one step. As a result, the divided clock signal iCK0EF in which the falling edge is delayed from the minimum value by two steps and the divided clock signal iCK0OF in which the falling edge is delayed from the minimum value by one step are input to the mixer 405, and are synthesized at a mixing ratio of 50%. Consequently, the divided clock signal iCK0 output from the DCA 112 has a waveform in which the rising edge is delayed by 1.5 steps.

Furthermore, when the count value of the counter 241 is incremented from 3 to 4, the control code CD14 is further increased by one bit, so that the pull-down capability of the inverter 404 is lowered by one step. Accordingly, the rising edge of the divided clock signal iCK0 is delayed in each of the even-path EP0 and the odd-path OP0 by two steps. As a result, the divided clock signal iCK0EF in which the falling edge is delayed from the minimum value by two steps and the divided clock signal iCK0OF in which the falling edge is delayed from the minimum value by two steps are input to the mixer 405, and are synthesized at a mixing ratio of 50%. Consequently, the divided clock signal iCK0 output from the DCA 112 has a waveform in which the rising edge is delayed by two steps.

As described above, every time the count value of the counter 241 is incremented, the pull-up capability of the inverter 401, the pull-up capability of the inverter 402, the pull-down capability of the inverter 403, and the pull-down capability of the inverter 404 are lowered in this order. This makes it possible to adjust the rising edge of the divided clock signal iCK0 by 0.5 steps although the mixing ratio of the mixer 405 is fixed to 50%. The above description can also be applied to a falling edge of the divided clock signal iCK0. That is, every time the count value of the counter 242 is incremented, the pull-up capability of the inverter 403, the pull-up capability of the inverter 404, the pull-down capability of the inverter 401, and the pull-down capability of the inverter 402 are lowered in this order. The DCA 122 also adjusts a rising edge and a falling edge of the divided clock signal iCK90 based on the count values of the counters 243 and 244 in an identical manner to the DCA 112.

Figure 16:
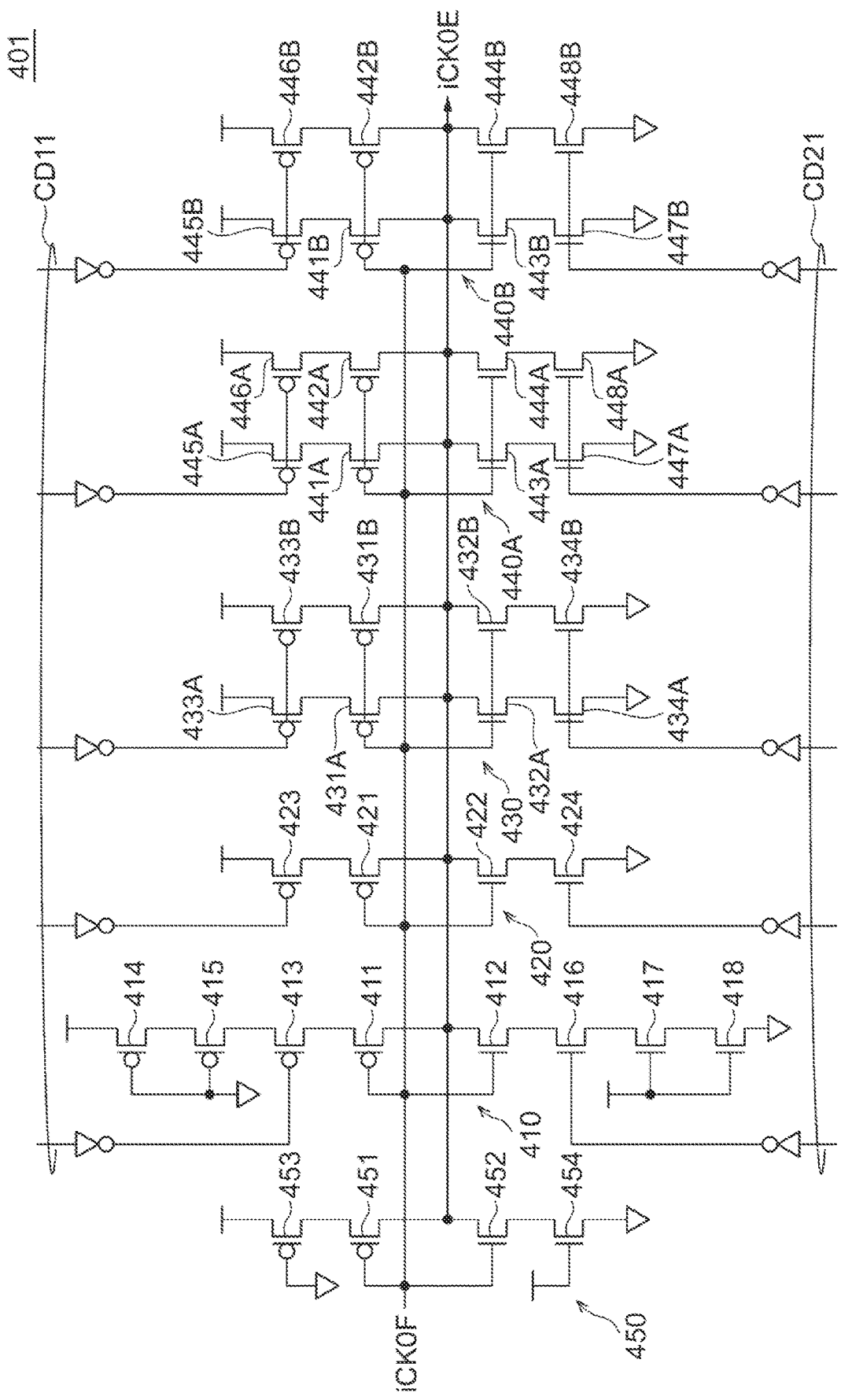
FIG. 16 is a circuit diagram of an inverter according to a modification.
Figure 17:
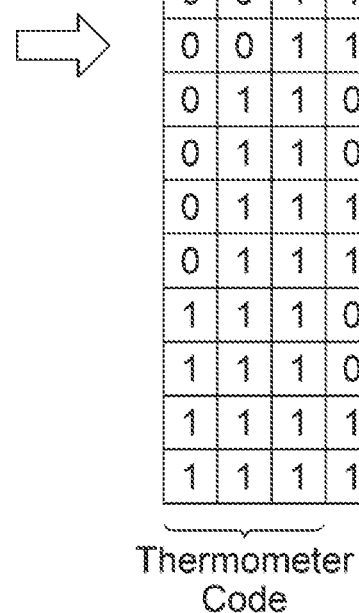
FIG. 17 is an example of a control code a part of which is thermometer-coded.

FIG. 16 is a circuit diagram of the inverter 401 according to a modification. The inverter 401 shown in FIG. 16 is different from the inverter 401 shown in FIG. 15 in that the inverter 440 is divided into inverters 440A and 440B. The inverter 440A is controlled by the transistors 445A, 446A, 447A, and 448A, and the inverter 440B is controlled by the transistors 445B, 446B, 447B, and 448B. Therefore, the inverters 430, 440A, and 440B are equal to each other in drive capability. In a case of using the inverter 401 shown in FIG. 16, the most significant bit of each of the control codes CD11 and CD21 shown in FIG. 13 is divided into two bits, whereby the upper three bits of each of the CD11 and CD21 are converted into a thermometer code as shown in FIG. 17. This configuration enables a glitch caused by inversion of the most significant bit to be prevented.

As described above, the semiconductor device according to the present embodiment detects phases of the four-phase internal clock signals CK0, CK90, CK180, and CK270 by means of the three DCDs 221 to 223 and, based on the detection result, controls rising edges and falling edges of the divided clock signals iCK0 and iCK90 that have phases different from each other by 90 degrees. In this manner, the periods UI0 to UI3 shown in FIG. 3 can be made uniform.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus, comprising:
a first clock path including a first duty-cycle adjuster configured to adjust a duty-cycle of a first input clock signal;
a second clock path including a second duty-cycle adjuster configured to adjust a duty-cycle of a second input clock signal having a different phase in 90 degrees from the first input clock signal; and
a control circuit configured to detect longest one of first, second, third, and fourth time periods to generate a control signal, wherein the first time period is defined by a phase difference between a rising edge of the first input clock signal and a rising edge of the second input clock signal, the second time period is defined by a phase difference between the rising edge of the second input clock signal and a falling edge of the first input clock signal, the third time period is defined by a phase difference between the falling edge of the first input clock signal and a falling edge of the second input clock signal, and the fourth time period is defined by a phase difference between the falling edge of the second input clock signal and the rising edge of the first input clock signal.

2. The apparatus as claimed in claim 1, wherein the first and second duty-cycle adjusters are configured to adjust the rising and falling edges of the first and second input clock signals, respectively, responsive to the control signal.

3. The apparatus as claimed in claim 1, wherein the control signal includes a first control signal that controls the rising edge of the first input clock signal, a second control signal that controls the falling edge of the first input clock signal, a third control signal that controls the rising edge of the second input clock signal, and a fourth control signal that controls the falling edge of the second input clock signal.

4. The apparatus as claimed in claim 1, wherein the control circuit is configured to, if the first time period is the longest one, increase a delay of the rising edge of the first input clock signal or decrease a delay of the rising edge of the second input clock signal.

5. The apparatus as claimed in claim 1,
wherein the first clock path further includes a first phase splitter configured to generate a first output clock signal and a third output clock signal having a different phase in 180 degrees from the first output clock signal, and
wherein the second clock path further includes a second phase splitter configured to generate a second output clock signal and a fourth output clock signal having a different phase in 180 degrees from the second output clock signal.

6. The apparatus as claimed in claim 5, wherein the control circuit includes:
a first duty-cycle detector configured to compare a duty-cycle of the first output clock signal with a duty-cycle of the third output clock signal;
a second duty-cycle detector configured to compare a duty-cycle of the second output clock signal with a duty-cycle of the fourth output clock signal; and
a third duty-cycle detector configured to detect phases among the first, second, third, and fourth output clock signals.

7. The apparatus as claimed in claim 6, wherein the control circuit is configured to generate the control signal responsive to output signals of the first, second, and third duty-cycle detectors.

8. An apparatus, comprising:
a first clock path including a first duty-cycle adjuster configured to adjust a duty-cycle of a first input clock signal;
a second clock path including a second duty-cycle adjuster configured to adjust a duty-cycle of a second input clock signal having a different phase in 90 degrees from the first input clock signal; and
a control circuit configured to detect shortest one of first, second, third, and fourth time periods to generate a control signal, wherein the first time period is defined by a phase difference between a rising edge of the first input clock signal and a rising edge of the second input clock signal, the second time period is defined by a phase difference between the rising edge of the second input clock signal and a falling edge of the first input clock signal, the third time period is defined by a phase difference between the falling edge of the first input clock signal and a falling edge of the second input clock signal, and the fourth time period is defined by a phase difference between the falling edge of the second input clock signal and the rising edge of the first input clock signal.

9. The apparatus as claimed in claim 8, wherein the first and second duty-cycle adjusters are configured to adjust the rising and falling edges of the first and second input clock signals, respectively, responsive to the control signal.

10. The apparatus as claimed in claim 8, wherein the control signal includes a first control signal that controls the rising edge of the first input clock signal, a second control signal that controls the falling edge of the first input clock signal, a third control signal that controls the rising edge of the second input clock signal, and a fourth control signal that controls the falling edge of the second input clock signal.

11. The apparatus as claimed in claim 8, wherein the control circuit is configured to, if the first time period is the shortest one, decrease a delay of the rising edge of the first input clock signal or increase a delay of the rising edge of the second input clock signal.

12. The apparatus as claimed in claim 8,
wherein the first clock path further includes a first phase splitter configured to generate a first output clock signal and a third output clock signal having a different phase in 180 degrees from the first output clock signal, and
wherein the second clock path further includes a second phase splitter configured to generate a second output clock signal and a fourth output clock signal having a different phase in 180 degrees from the second output clock signal.

13. The apparatus as claimed in claim 12, wherein the control circuit includes:
a first duty-cycle detector configured to compare a duty-cycle of the first output clock signal with a duty-cycle of the third output clock signal;
a second duty-cycle detector configured to compare a duty-cycle of the second output clock signal with a duty-cycle of the fourth output clock signal; and
a third duty-cycle detector configured to detect phases among the first, second, third, and fourth output clock signals.

14. The apparatus as claimed in claim 13, wherein the control circuit is configured to generate the control signal responsive to output signals of the first, second, and third duty-cycle detectors.

15. An apparatus, comprising:
a first clock path including a first duty-cycle adjuster of a first input clock signal;
a second clock path including a second duty-cycle adjuster of a second input clock signal having a different phase from the first input clock signal; and
a control circuit configured to:
   detect longest one and shortest one of first, second, third, and fourth time periods to generate a control signal, wherein the first time period is defined by a phase difference between a rising edge of the first input clock signal and a rising edge of the second input clock signal, the second time period is defined by a phase difference between the rising edge of the second input clock signal and a falling edge of the first input clock signal, the third time period is defined by a phase difference between the falling edge of the first input clock signal and a falling edge of the second input clock signal, and the fourth time period is defined by a phase difference between the falling edge of the second input clock signal and the rising edge of the first input clock signal;
   if the first time period is the longest one, increase a delay of the rising edge of the first input clock signal or decrease a delay of the rising edge of the second input clock signal; and
   if the first time period is the shortest one, decrease a delay of the rising edge of the first input clock signal or increase a delay of the rising edge of the second input clock signal.

16. The apparatus as claimed in claim 15, wherein the first and second duty-cycle adjusters are configured to adjust the rising and falling edges of the first and second input clock signals, respectively, responsive to the control signal.

17. The apparatus as claimed in claim 15, wherein the control signal includes a first control signal that controls the rising edge of the first input clock signal, a second control signal that controls the falling edge of the first input clock signal, a third control signal that controls the rising edge of the second input clock signal, and a fourth control signal that controls the falling edge of the second input clock signal.

18. The apparatus as claimed in claim 15,
wherein the first clock path further includes a first phase splitter configured to generate a first output clock signal and a third output clock signal having a different phase in 180 degrees from the first output clock signal, and
wherein the second clock path further includes a second phase splitter configured to generate a second output clock signal and a fourth output clock signal having a different phase in 180 degrees from the second output clock signal.

19. The apparatus as claimed in claim 18, wherein the control circuit includes:
a first duty-cycle detector configured to compare a duty-cycle of the first output clock signal with a duty-cycle of the third output clock signal;
a second duty-cycle detector configured to compare a duty-cycle of the second output clock signal with a duty-cycle of the fourth output clock signal; and
a third duty-cycle detector configured to detect phases among the first, second, third, and fourth output clock signals.

20. The apparatus as claimed in claim 19, wherein the control circuit is configured to generate the control signal responsive to output signals of the first, second, and third duty-cycle detectors.

* * * * *